United States Patent
Feng et al.

(10) Patent No.: US 11,038,321 B2
(45) Date of Patent: Jun. 15, 2021

(54) SINGLE MODE VCSELS WITH LOW THRESHOLD AND HIGH SPEED OPERATION

(71) Applicant: The Board of Trustees of the University of Illinois, Urbana, IL (US)

(72) Inventors: Milton Feng, Champaign, IL (US); Xin Yu, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 39 days.

(21) Appl. No.: 16/600,030

(22) Filed: Oct. 11, 2019

(65) Prior Publication Data

US 2020/0119521 A1    Apr. 16, 2020

Related U.S. Application Data

(60) Provisional application No. 62/744,704, filed on Oct. 12, 2018.

(51) Int. Cl.
*H01S 5/183* (2006.01)
*H01S 5/065* (2006.01)
*H01S 5/125* (2006.01)

(52) U.S. Cl.
CPC .......... *H01S 5/18313* (2013.01); *H01S 5/065* (2013.01); *H01S 5/125* (2013.01); *H01S 5/18394* (2013.01)

(58) Field of Classification Search
CPC .. H01S 5/18313; H01S 5/065; H01S 5/18394; H01S 5/18344; H01S 2301/163; H01S 5/18327

(Continued)

(56) References Cited

U.S. PATENT DOCUMENTS 7,078,257 B2 * 7/2006 Sakamoto .......... H01S 5/18311
438/39
7,433,381 B2 * 10/2008 Wang .................... B82Y 20/00
372/50.124

(Continued)

OTHER PUBLICATIONS

Kesler et al., "Transverse mode control in proton-implanted and oxide-confined VCSELs via patterned dielectric anti-phase filters", Proceedings of SPIE, vol. 10122, 2017.

(Continued)

*Primary Examiner* — Tuan N Nguyen
(74) *Attorney, Agent, or Firm* — McDonnell Boehnen Hulbert & Berghoff LLP

(57) ABSTRACT

Vertical-cavity surface-emitting lasers (VCSELs) and methods for making such are provided. The VCSELs include stepped upper reflectors having respective differently-sized apertures. This allows the lower portion of the reflector to have formed therein a wider-diameter aperture to allow for increased current injection. The upper portion of the reflector has formed therein a narrower-diameter, mode-selecting aperture to allow higher-order modes to be reduced, leading to single-mode operation. The VCSELs are thus capable of higher-power emission in a single mode, allowing for longer-distance signaling over optical fiber, despite modal dispersion within the fiber and/or at the coupling between the VCSEL and the fiber. The two differently-sized apertures can be formed via respective lateral oxidation processes following etch-down to form the respective steps of the upper reflector. Differences in composition across the upper reflector results in temperature-dependence of the oxidation process, allowing the apertures to be formed with different sizes.

20 Claims, 23 Drawing Sheets

(58) Field of Classification Search
USPC .................................................. 372/50.124
See application file for complete search history.

(56) References Cited

U.S. PATENT DOCUMENTS

| | | | |
|---|---|---|---|
| 7,796,662 B2* | 9/2010 | Uchida | H01S 5/18313 |
| | | | 372/46.013 |
| 9,269,862 B2* | 2/2016 | Lo | H01L 33/10 |
| 2005/0123014 A1* | 6/2005 | Shimizu | H01S 5/18313 |
| | | | 372/45.01 |
| 2008/0205465 A1* | 8/2008 | Nguyen | H01S 5/18352 |
| | | | 372/45.01 |

OTHER PUBLICATIONS

Unold et al., Single-Mode VCSELs, Proceedings of SPIE, vol. 4649, 2002.
Chang et al., "Single-mode operation of VCSELs with a mode selective aperture", Appl. Phys. B 89, 231-234 (2007).
Huffaker et al., "Native-oxide defined ring contact for low threshold vertical-cavity lasers", Appl. Phys. Lett. 65, 97 (1994).
Kroner et al., "High-performance single fundamental mode AlGaAs VCSELs wth mode-selective mirror reflectivities", Optics Communications 270 (2007) pp. 332-335.
Unold et al., "Large-Area Single-Mode VCSELs and the Self-Aligned Surface Relief", IEEE Journal on Selected Topics in Quantum Electronics, vol. 7, No. 2, Mar./Apr. 2001.
Chorchos et al., "High speed 850 nm single mode and multi mode VCSEL transmission over multimode fiber", Proc. of SPIE, vol. 10325, 2017.
Kardosh et al., "High-Power Single Transverse Mode Vertical-Cavity Surface-Emitting Lasers With Monolithically Integrated Curved Dielectric Mirrors", IEEE Photonics Technology Letters, vol. 20, No. 24, Dec. 15, 2008.
Martinsson et al., "Transverse Mode Selection in Large-Area Oxide-Confined Vertical-Cavity Surface-Emitting Lasers Using a Shallow Surface Relief", IEEE Photonics Technology Letters, vol. 11, No. 12, Dec. 1999.
Unold et al., "Improving Single-Mode VCSEL Performance by Introducing a Long Monolithic Cavity", IEEE Photonics Technology Letters, vol. 12, No. 8, Aug. 2000.
Dziura et al., "Singlemode Surface Emitting Laser Using Partial Mirror Disordering", Electronics Letters, Jul. 8, 1993, vol. 29, No. 14, pp. 1236-1237.
Kesler et al., "Facilitating Single-Transverse-Mode Lasing in VCSELs via Patterned Dielectric Anti-Phase Filters", IEEE Photonics Technology Letters, vol. 28, No. 14, Jul. 15, 2016, pp. 1497-1500.
Moser et al., "85-fJ Dissipated Energy er Bit at 30 Gb/s Across 500-m Multimode Fiber Using 850-nm VCSELs", IEEE Photonics Technology Letters, vol. 25, No. 16, Aug. 15, 2013, pp. 1638-1641.
Westbergh et al., "High-speed 850 nm VCSELs operating error free up to 57 Gbit/s", Electronics Letters, Aug. 1, 2013, vol. 49, No. 16.
Furukawa et al., "High-power single-mode vertical-cavity surface-emitting lasers with triangular hole structure", Applied Physics Letters, vol. 85, No. 22, Nov. 29, 2004.
Safaisini et al., "20 Gbit/s data transmission over 2 km multimode fibre using 850 nm mode filter VCSEL", Electronics Letters, Jan. 2, 2014, vol. 50, No. 1, pp. 40-42.
Yang et al., "Singlemode (SMSR> 40 dB) proton-implanted photonic crystal vertical-cavity surface-emitting lasers", Electronics Letters, Mar. 17, 2005, vol. 41, No. 6.
Grundl et al., "Record Single-Mode, High-Power VCSELs by Inhibition of Spatial Hole Burning", IEEE Journal of Selected Topics in Quantum Electronics, vol. 19, No. 4, Jul./Aug. 2013.
Simpanen et al., "1060 nm single-mode vertical-cavity surface-emitting laser operating at 50 Gbit/s data rate", Electronics Letters, Jun. 22, 2017, vol. 53, No. 13, pp. 869-871.
Zhou et al., "High-Power Single-Mode Antiresonant Reflecting Optical Waveguide-Type Vertical-Cavity Surface-Emitting Lasers", IEEE Journal of Quantum Electronics, vol. 38, No. 12, Dec. 2002.
Haglund et al., "Single Fundamental-Mode Output Power Exceeding 6 mW From VCSELs With a Shallow Surface Relief", IEEE Photonics Technology Letters, vol. 16, No. 2, Feb. 2004.

\* cited by examiner

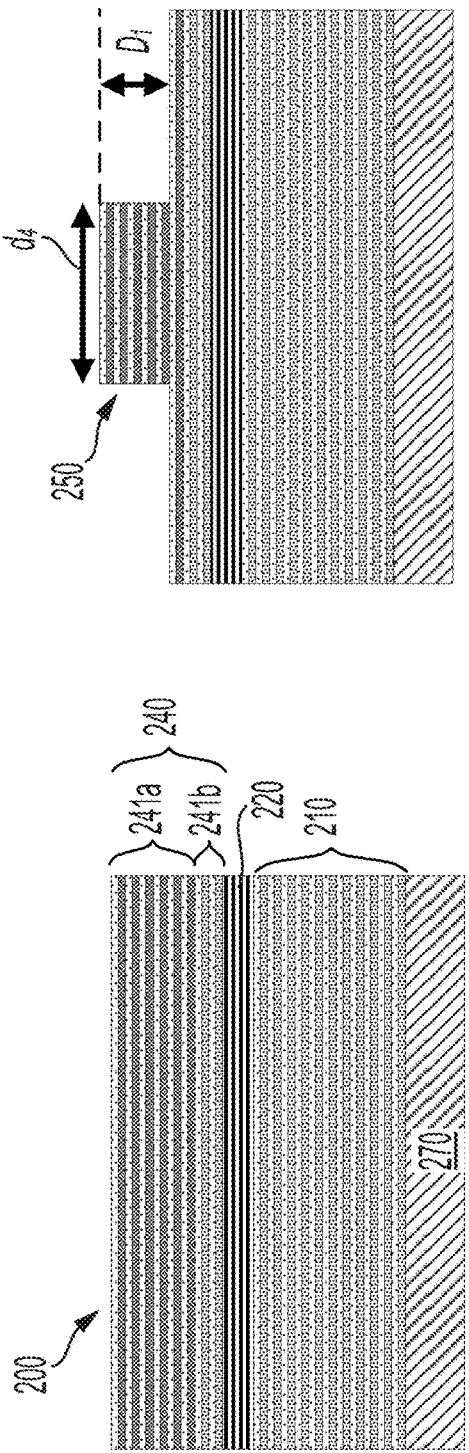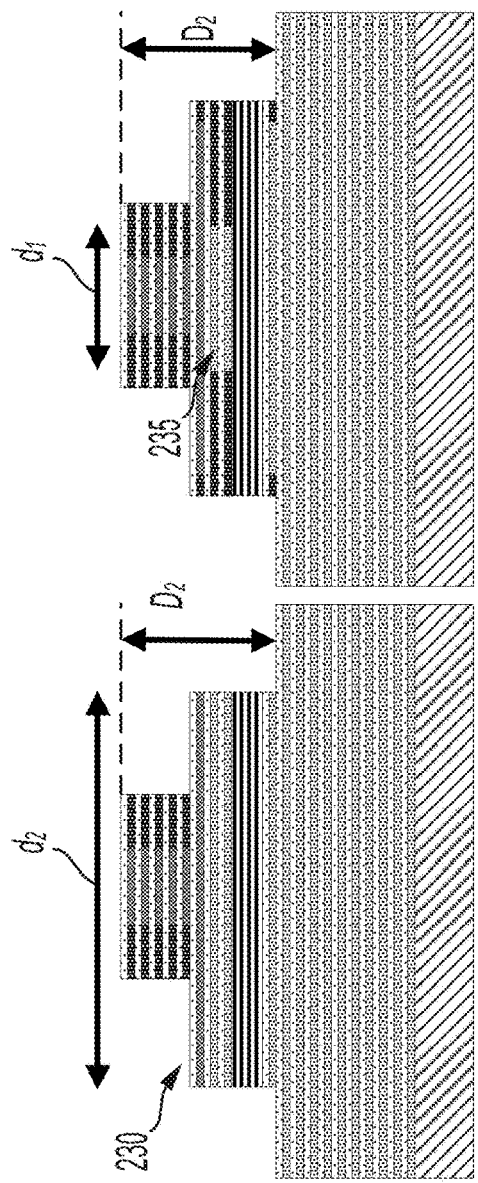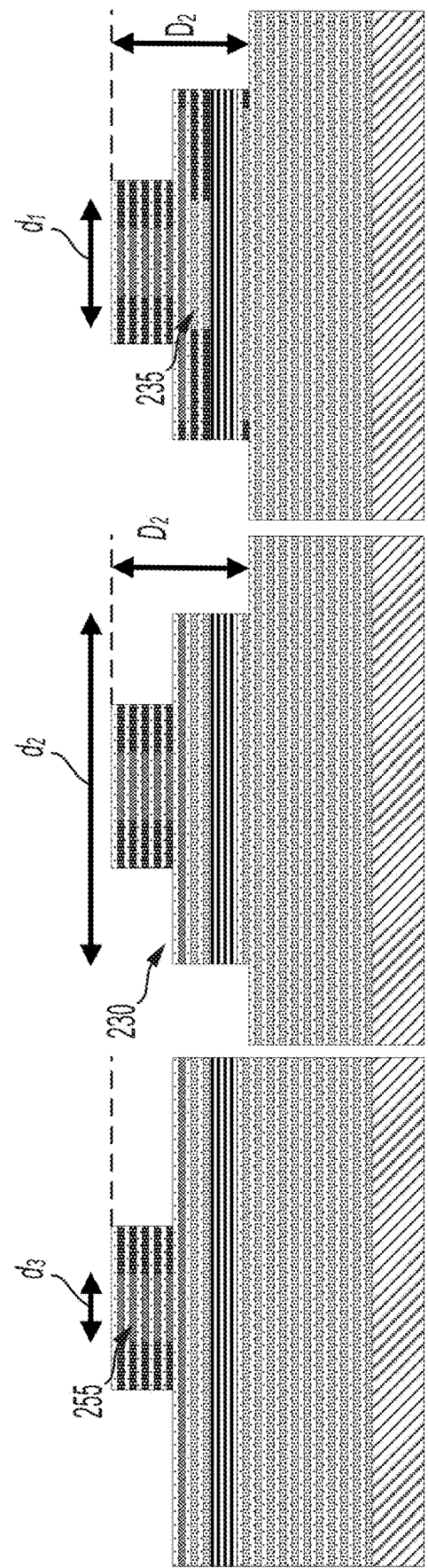

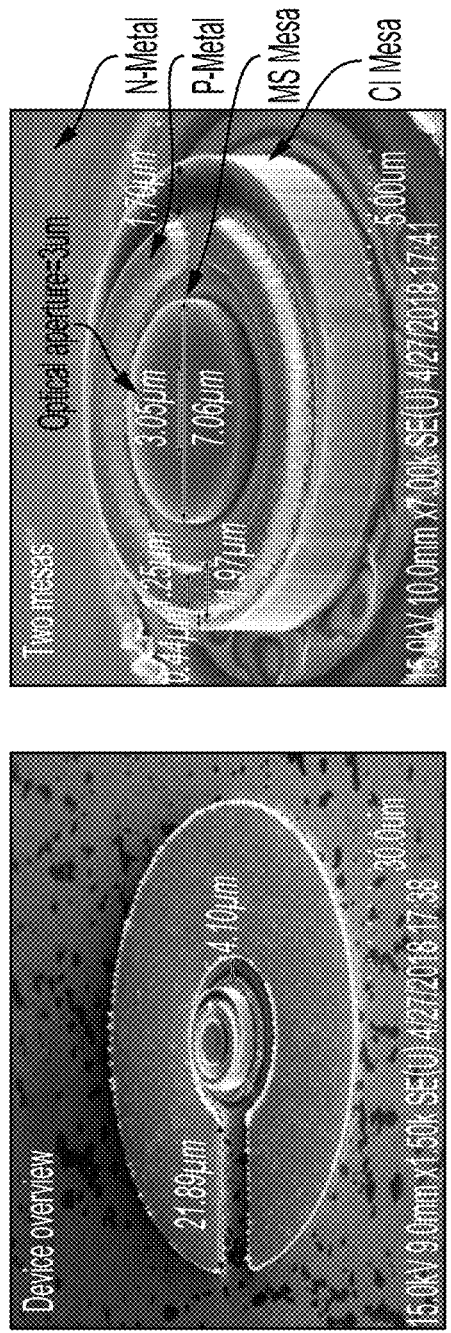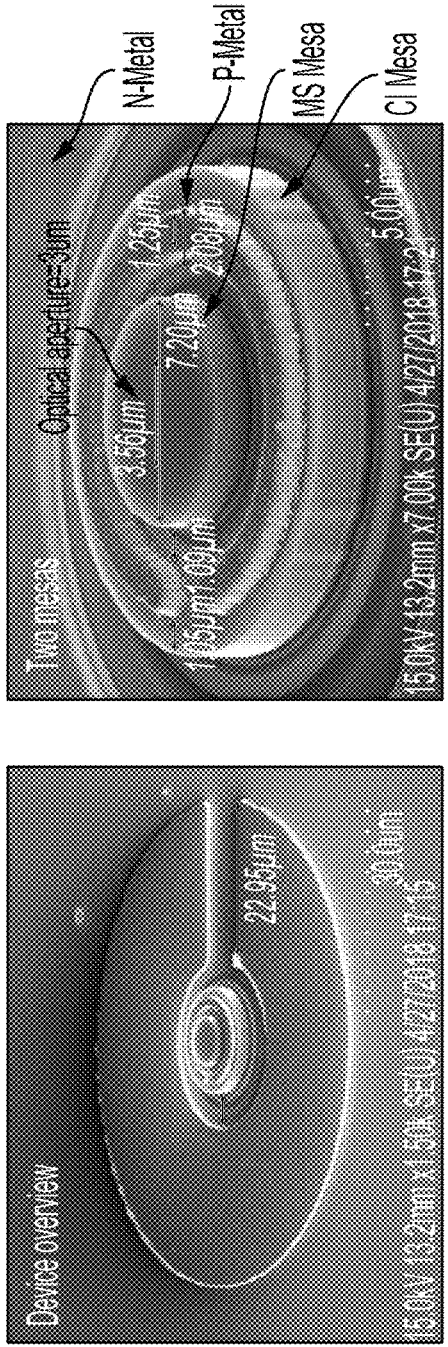
FIG. 6

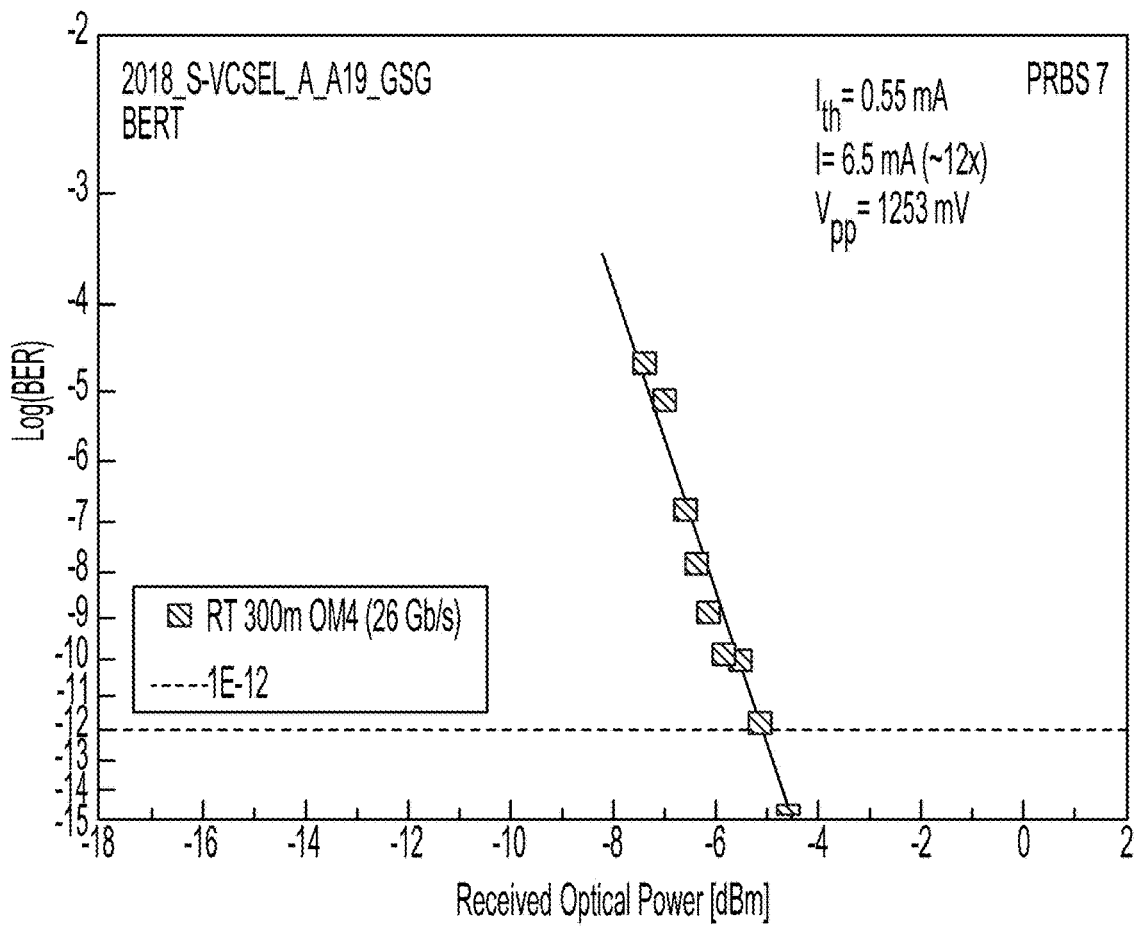
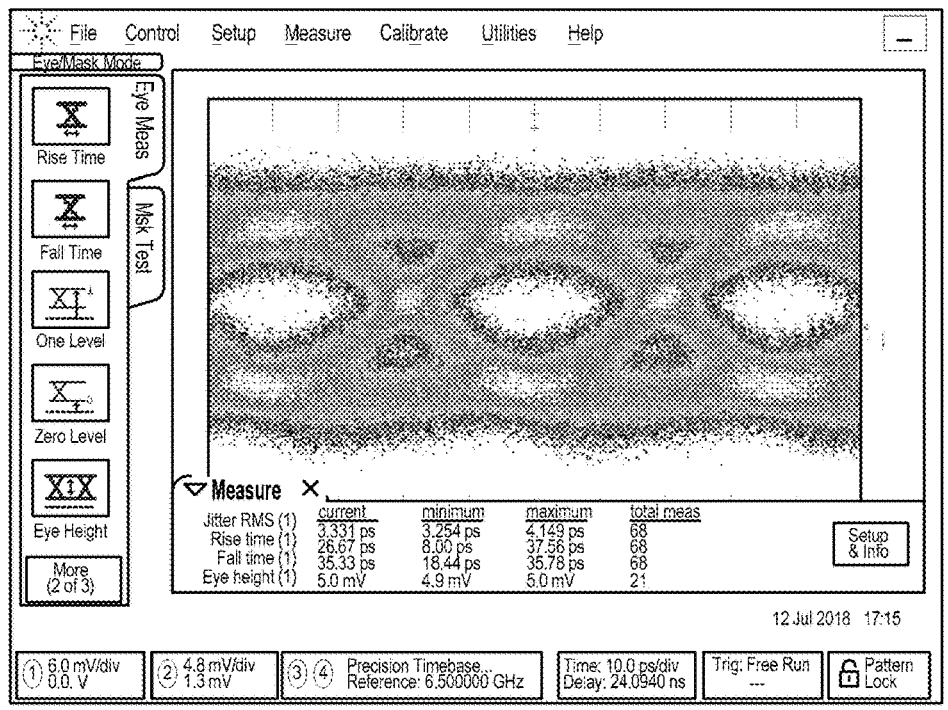
FIG. 11B

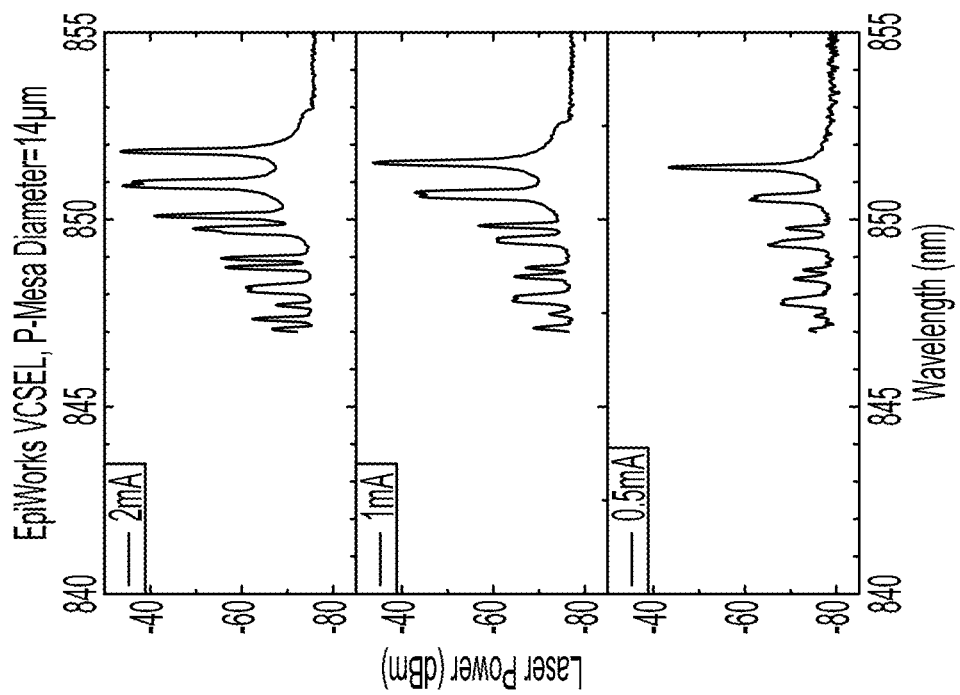
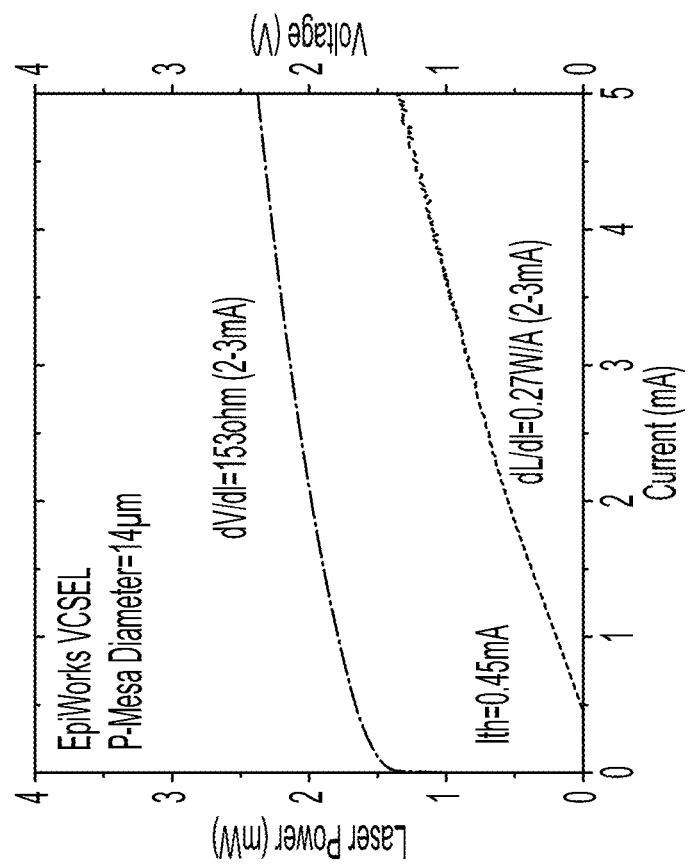
FIG. 16

SINGLE MODE VCSELS WITH LOW THRESHOLD AND HIGH SPEED OPERATION

CROSS-REFERENCE TO RELATED APPLICATION

This application claims the benefit of and incorporates by reference the content of U.S. Provisional Pat. App. No. 62/744,704, filed Oct. 12, 2018.

STATEMENT REGARDING FEDERALLY SPONSORED RESEARCH OR DEVELOPMENT

This invention was made with government support under W911NF-17-1-0112 and W911NF-15-1-0579 awarded by the United States Army. The government has certain rights in the invention.

BACKGROUND

Lasers can be operated to transmit information over long distances, e.g., through optical fibers. The intensity or other properties of the emitted laser light can be modulated to represent the transmitted information. The use of lasers to transmit information optically provides a number of benefits, including immunity from RF noise, minimal dissipative losses to the fiber transmission medium, ease of sourcing low-cost, high bandwidth emitters and receivers, and other benefits.

The light emitted from such a laser could be single-mode or multi-mode. Single-mode light has power in a primary mode (or wavelength) and substantially no power in higher-order modes (e.g., the power in the primary mode is more than 30 dB greater than the power in any higher order mode), while multi-mode light includes significant power in modes other than the primary mode. Generally, the ability to transmit information optically over distances is limited when using multi-mode light due to chromatic dispersion within the fiber, wavelength-dependent coupling between the laser and the fiber or between other elements of the channel, or other mechanisms.

A variety of laser types and configurations may be employed to transmit light for optical communications. Vertical-cavity surface-emitting lasers (VCSELs) are a popular choice due to low cost, high power, and high bandwidth. However, most commercially-available VCSELs generate multi-mode light.

SUMMARY

Vertical-cavity surface-emitting lasers (VCSELs) can be used to provide laser light in a variety of applications. For example, VCSELs can be used to generate modulated light for optical communications (e.g., via an optical fiber), to generate laser light to perform a 3-D scan of an environment (e.g., by generating a pattern of structured illumination, by generating a scanning beam that can scan the environment), to generate laser light for reading and/or writing an optical data storage medium, or to generate laser light for some other application. VCSELs are an attractive source of laser light as they provide low cost, high efficiency, small size, high power, high bandwidth, and other beneficial characteristics.

Commercially-available VCSELs commonly generate multi-mode light, that is, light that includes power in a primary mode (or wavelength) and at a number of higher-order modes (e.g., multiples of the primary mode wavelength). Such multi-mode operation may result in reduced performance in certain applications. For example, when multi-mode light is used to optically transmit information via an optical fiber, the distance over which the information can be transmitted may be reduced by modal dispersion within the fiber and/or by wavelength-dependent coupling between the laser and the fiber and/or between other elements of the communications channel.

Previous methods to modify VCSELs to generate single-mode light resulted in increased laser threshold, lower bandwidth, higher $R_{IN}$ noise, lower data rate operation, or other unwanted effects. Additionally, these previous methods require multiple additional process steps which may hamper high yield manufacturing and/or increase unit costs.

The single-mode VCSEL embodiments described herein provide improvements over previous methods. Specifically, some embodiments could utilize a multiple-level, multiple-aperture VCSEL design that includes a two-element upper reflector. In such scenarios, the lower element of the upper reflector could include a wider-diameter aperture, allowing more current to be injected into the active gain region of the device. Furthermore, the upper element of the upper reflector includes a narrower-diameter aperture that acts to select the primary mode, filtering higher-order modes. Since current is not injected into the gain medium via this mode-selection aperture, it can be set to a smaller diameter (e.g., to a diameter sufficient to reduce higher-order modes to less than 30 dB less than the primary mode power) without substantially affecting the input impedance, current density, power, or other electrical characteristics of the VCSEL.

Methods for making such a VCSEL are also provided. These methods include applying multiple processes to induce lateral oxidation of layers within the upper reflector. The composition of the upper reflector varies from top to bottom (e.g., with respect to the percentage aluminum content of $Al_xGa_{1-x}As$ layers), such that the rate of this lateral oxidation is temperature-dependent or dependent on some other controllable process variable. Accordingly, the diameter of the apertures in the upper and lower portions of the upper reflector can be set to different diameters to provide the benefits described herein.

An aspect of the present disclosure relates to a vertical-cavity surface-emitting laser including: (i) a base reflective element; (ii) a gain element; (iii) a current-injection reflective element; (iv) an electrode; and (v) a mode-selective reflective element. The current-injection reflective element includes a first portion of a first distributed Bragg reflector (DBR) and a current-injection aperture having a first diameter. The gain element is disposed between the base reflective element and the current-injection reflective element. At least a portion of the current-injection element has a second diameter that is greater than the first diameter. The electrode is electrically coupled to the current-injection reflective layer such that current passing though the electrode into the current-injection reflective element passes into the gain element via the current-injection aperture. The mode-selective reflective element includes a second portion of the first DBR and a mode-selective aperture having a third diameter that is less than the first diameter. The current-injection reflective element is disposed between the gain element and the mode-selective reflective element. At least a portion of the mode-selective reflective element has a fourth diameter that is greater than the third diameter.

Another aspect of the present disclosure relates to a method for fabricating a vertical-cavity surface-emitting laser, the method including: (i) forming a mode-selective reflective mesa having a first diameter from a substrate, wherein forming the mode-selective reflective mesa from the substrate comprises etching at least a portion of the substrate to a depth less than a first thickness; (ii) forming, in the mode-selective mesa via lateral oxidation at a first temperature, a mode-selective aperture having a second diameter that is less than the first diameter; (iii) forming a current-injection reflective mesa having a third diameter from the substrate, wherein the third diameter is greater than the first diameter, and wherein forming the current-injection reflective mesa from the substrate comprises etching at least a portion of the substrate to a depth greater than the first thickness; and (iv) forming, in the current-injection mesa via lateral oxidation at a second temperature, a current injection aperture having a fourth diameter that is less than the third diameter and that is greater than the second diameter. The substrate includes: (a) a base reflective element; (b) a gain element; (c) a first upper reflective element having the first thickness, wherein the first upper reflective element includes at least one layer-pair of a distributed Bragg reflector (DBR) having a first composition, and wherein the gain element is disposed within the substrate between the base reflective element and the first upper reflective element; and (d) a second upper reflective element, wherein the second upper reflective element comprises at least one layer-pair of a DBR having a second composition that differs from the first composition, and wherein the second upper reflective element is disposed within the substrate between the gain element and the first upper reflective element.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

BRIEF DESCRIPTION OF THE FIGURES

FIG. 2A illustrates, in cross-section, a substrate to be formed into a VCSEL via an example process.
FIG. 2B illustrates, in cross-section, the substrate of FIG. 2A having undergone a portion of an example process.
FIG. 2C illustrates, in cross-section, the substrate of FIG. 2A having undergone a portion of an example process.
FIG. 2D illustrates, in cross-section, the substrate of FIG. 2A having undergone a portion of an example process.
FIG. 2E illustrates, in cross-section, the substrate of FIG. 2A having undergone a portion of an example process.
FIG. 6 illustrates scanning electron micrographs of example VCSELs.
FIG. 11B illustrates data transmission properties of an example VCSEL.
FIG. 16 illustrates the L-I-V characteristics and optical spectrum of an example VCSEL.

DETAILED DESCRIPTION

Figure 1A:
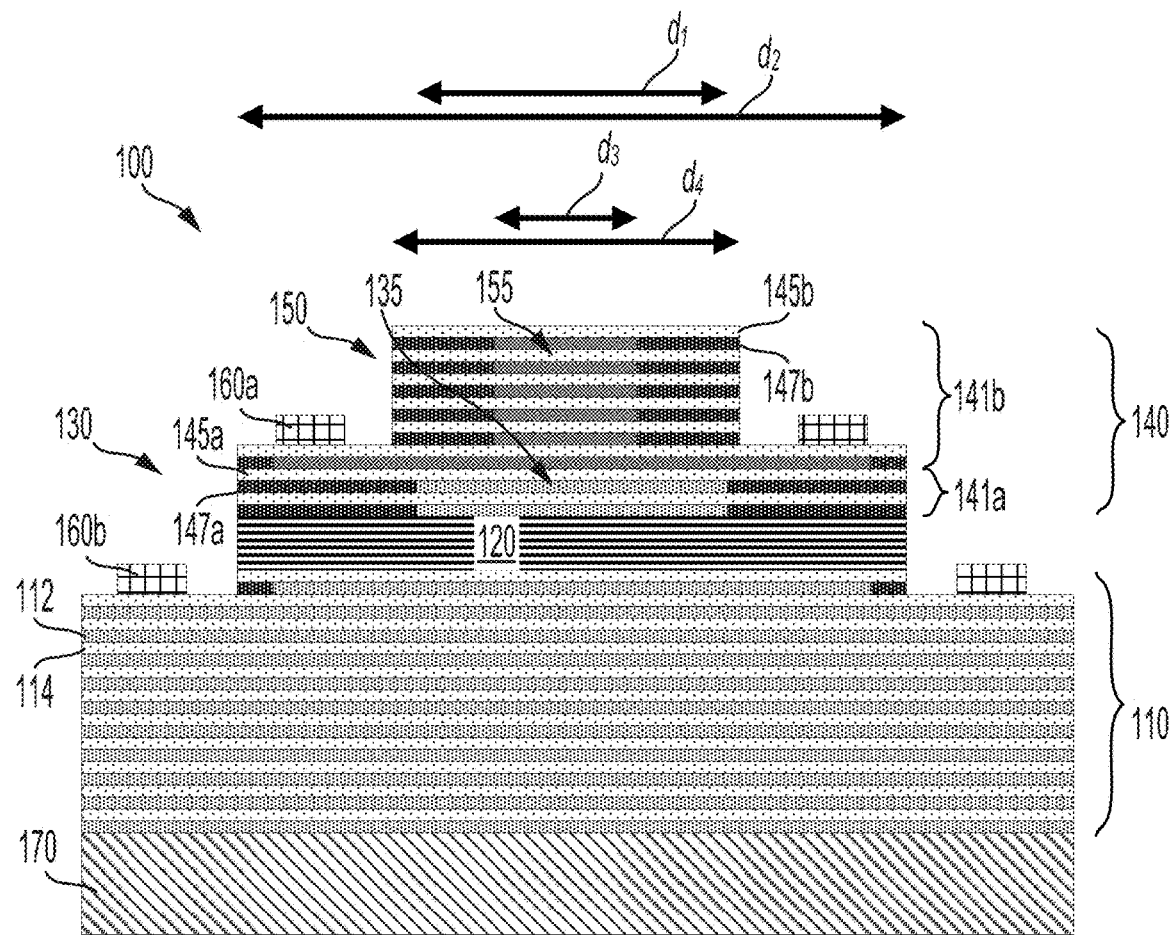
FIG. 1A illustrates, in cross-section, an VCSEL.

Examples of methods and systems are described herein. It should be understood that the words "exemplary," "example," and "illustrative," are used herein to mean "serving as an example, instance, or illustration." Any embodiment or feature described herein as "exemplary," "example," or "illustrative," is not necessarily to be construed as preferred or advantageous over other embodiments or features. Further, the exemplary embodiments described herein are not meant to be limiting. It will be readily understood that certain aspects of the disclosed systems and methods can be arranged and combined in a wide variety of different configurations.

It should be understood that the below embodiments, and other embodiments described herein, are provided for explanatory purposes, and are not intended to be limiting.

I. EXAMPLE VERTICAL-CAVITY SURFACE-EMITTING LASERS AND METHODS FOR FABRICATING SAME

Many VCSELs operate to generate multi-mode light; that is, they generate laser light that includes power at a primary mode and significant power at higher order modes (e.g., at wavelengths that are multiples of the primary mode). For example, the power in one of the higher-order modes could be more than a power level that is 30 dB (or some other threshold level) less than the power in the primary mode. Such multi-mode operation may be unwanted, e.g., in communications applications where the ability of such multi-mode light to transmit optical information is limited by modal dispersion in an optical fiber, wavelength-dependent coupling between the VCSEL and the optical fiber, or other processes.

Accordingly, VCSELs that operate to generate single-mode (SM) light are desirable in some applications. SM-VCSELs generate light wherein the power in a primary mode of the light is greater than the power in any higher-order mode by more than a threshold degree (e.g., the power in the primary mode is at least 30 dB greater than the power in any higher-order mode). A variety of techniques are available to configure and/or fabricate a VCSEL to generate SM light. In some examples, the diameter of an aperture formed in a reflector of the VCSEL can be narrowed to reduce the amount of energy in higher order modes of the emitted light. Such a narrow aperture may be referred to as a "mode-selective" (MS) aperture. However, in embodiments wherein current is injected into the gain medium of the VCSEL via the same aperture used to perform this mode selection, the degree of mode-selectivity of the VCSEL and the power level of the VCSEL may be in tension. For example, narrowing the diameter of the aperture may improve the mode-selectivity of the VCSEL (reducing the power in higher-order modes and/or increasing the power in a primary mode) while also reducing the power of the VCSEL, increasing the input resistance of the VCSEL, increasing the power density and/or temperature of the VCSEL, and/or causing some other unwanted effects on the performance of the VCSEL.

To overcome these limitations, VCSEL embodiments described herein provide multiple, differently-sized apertures. Accordingly, a larger aperture may be used to inject current into the gain medium of the VCSEL, increasing the power of the VCSEL, while a smaller aperture is used for mode-selection, allowing the mode selectivity of the VCSEL to be improved. This multiple-aperture design is made possible by forming the different apertures in respective different portions of a reflector (e.g., a distributed Bragg Reflector (DBR)) of the VCSEL. For example, a first set of layer-pairs of a DBR of the VCSEL could have formed therein a current-injection aperture via which current is injected into the gain medium of the VCSEL. A second set of layer-pairs of the DBR, located opposite the first set of layer-pairs from the gain medium, could have formed therein a narrower, more mode-selective aperture.

A "layer-pair" of a DBR, as used herein, refers to a pair of layers within a multi-layer DBR. The pair of layers differ with respect to composition (e.g., with respect to an amount or presence of aluminum) and optical properties (e.g., a dielectric constant) such that a plurality of layer pairs, stacked together, form the DBR and are capable of reflecting light at one or more wavelengths via patterns of constructive and destructive interference within the DBR. For example, a DBR may include 20 layer-pairs, each layer-pair including a layer of GaAs and a layer of $Al_XGa_{1-X}As$. Thus, this example DBR includes 20 layers of GaAs and 20 layers of $Al_XGa_{1-X}As$, with the layers of GaAs alternating with the layers of $Al_XGa_{1-X}As$ within the DBR. The composition of each layer-pair of a DBR could be the same, or could vary across the DBR. A DBR could include an integer number of layer-pairs (e.g., 20 layers of a first composition alternating with 20 layers of another composition), or could include a half-integer number of layer-pairs (e.g., 21 layers of a first composition alternating with 20 layers of another composition).

An overall number of layer-pairs within a DBR may be specified in order to control the overall reflectivity of the DBR, with greater numbers of layer-pairs generally increasing the overall reflectivity of the DBR. The reflection spectrum of the DBR (e.g., the identity of the wavelengths and/or ranges of wavelengths that will be efficiently reflected by the DBR) may be controlled by adjusting the optical properties (e.g., dielectric constants) of the layers of the DBR and/or by adjusting the thicknesses of the layers.

While layer-pairs are described herein, it will be understood that other layer arrangements, including further interfacial layers and/or superlattice layer arrangements, are contemplated and possible within the scope of the present disclosure.

A single-mode VCSEL as described herein could provide a variety of benefits. Such a VCSEL, having a wider aperture for current injection while also having another, smaller mode-selection aperture could exhibit reduced current and/or power density within the current injection aperture, increased overall emitted beam power, reduced input resistance/impedance, reduced operating temperature, and/or other benefits, across a range of operating temperatures and current, while maintaining the power in the primary mode of the emitted light at a level more than a threshold amount (e.g., 30 dB) greater than the power in any higher-order mode of the emitted light. For example, a single-mode VCSEL as described herein can be fabricated, with an appropriately-sized mode-selection aperture, such that the VCSEL emits light having a first mode power that is at least 30 dB greater than a second mode power of the emitted light when the VCSEL is operating at any temperature within an operating temperature range between 0 degrees Celsius and 85 degrees Celsius and when a supra-threshold current is applied to the VCSEL (e.g., a current having any level between a threshold current level of the VCSEL and twice the threshold current level).

Figure 1B:
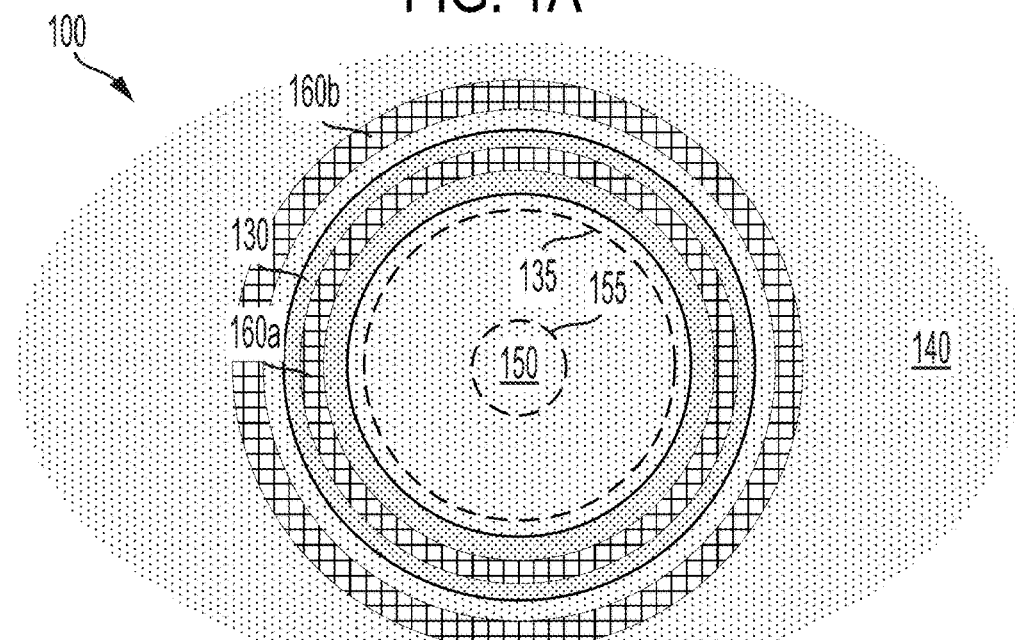
FIG. 1B illustrates, from above, the example VCSEL of FIG. 1A.

FIGS. 1A and 1B illustrate schematic cross-sectional and overhead views of such a single-mode VCSEL 100. The VCSEL 100 includes a substrate element 170, a base reflective element 110, a gain element 120, a current-injection reflective element 130 (which may be referred to as a current-injection mesa), a mode-selective reflective element 150 (which may be referred to as a mode-selective mesa), and first 160a and second 160b electrodes through which current can be injected into/out of the VCSEL 100, causing the VCSEL 100 to generate light emissions. The current-injection reflective element 130 includes a first portion of a first DBR 140 (the lower three layer-pairs of the first DBR 140) and the mode-selective reflective element 150 includes a second portion of the first DBR 140 (the upper five layer-pairs of the first DBR 140).

The current-injection reflective element 130 includes a circular current-injection aperture 135 having a first diameter, $d_1$. The current-injection reflective element 130 is cylindrically-shaped and has a second diameter, $d_2$, that is wider than $d_1$. The mode-selective reflective element 150 includes a circular mode-selective aperture 155 having a third diameter, $d_3$. The mode-selective reflective element 150 is cylindrically-shaped and has a fourth diameter, $d_4$, that is wider than $d_2$ and narrower than the diameter of the current-injection reflective element 130, $d_2$. As shown in FIGS. 1A and 1B, the diameter of the current-injection aperture, $d_1$, may be less than the diameter of the mode-selective reflective element 150, $d_4$, in order to prevent light generated by the gain element 120 from leaking out around the edge of the mode-selective reflective element 150.

The diameter of the mode-selective aperture 155, $d_3$, may be selected in order to ensure that the VCSEL 100 emits substantially single-mode light of a specified wavelength across and range of operating conditions (e.g., a range of temperatures and injected current levels). This can include specifying the diameter of the mode-selective aperture 155 such that the power in the first mode of the emitted light is more than a threshold degree (e.g., 30 dB) greater than the power in any other mode of the emitted light. Accordingly, in some embodiments the diameter of the mode-selective aperture 155 is between 2.5 microns and 3.5 microns. In some embodiments, increases in the diameter of the current-injection aperture 135 may result in increased production in light at higher-order modes, such that the diameter of the mode-selective aperture 155 may be selected based on the diameter of the current-injection aperture 135. For example, the diameter of the mode-selective aperture 155 could be selected such that the diameter of the current-injection aperture 135 is greater than twice the diameter of the mode-selective aperture 155.

The number of layers or layer-pairs of the first DBR 140 that are included as part of the mode-selective reflective element 150 could be selected in order to ensure that the light emitted by the VCSEL is substantially single-mode (e.g., to ensure that the power of a first mode of the emitted light is more than 30 dB greater than the power in a second mode of the emitted light or any other higher-order mode of the emitted light). This could include forming the mode-selective reflective element 150 to have more than ten layer-pairs, or more than 15 layer-pairs.

The gain element 120 could be configured in a variety of ways to provide a laser gain medium that can generate laser photons in response to the passage of current through the gain element 120 (e.g., through a region of the gain element 120 proximate to the current-injection aperture 135). The thickness of the gain element 120 could be equal to a wavelength of a primary mode of the VSCEL 100 (e.g., equal to a wavelength to 850 nm light) or a multiple or fraction of the wavelength of the primary mode of the VCSEL 100. The gain element 120 could include one or more quantum well for transducing applied current into electron-hole pairs or into some other mechanism which can result in the generation of laser photons. For example, the gain element 120 could include one or more (e.g., three) $Al_{0.3}Ga_{0.7}As$ quantum-wells, with $Al_{0.3-0.9}Ga_{0.7-0.1}As$ cladding layer(s).

The base reflective element 110 could be a second DBR, as illustrated in FIG. 1A. The second DBR could include a plurality of layers and/or layer-pairs, each layer-pair including two adjacent layers that differ with respect to composition and/or optical properties so as to function, in aggregate, as a DBR. The composition of the layer-pairs could vary from layer-pair to layer-pair, or could be substantially the same across all layer-pairs of the base reflective element 110. For example, a first alternating set of layers of the base reflective element 110 (including, e.g., layer 112) could have a GaAs composition and a second alternating set of layers of the base reflective element 110 (including, e.g., layer 114) could have an $Al_xGa_{1-x}As$ composition. The layers of the base reflective element 110 could be doped to facilitate current flow from the second electrode 160b to the gain element 120 or to provide some other benefit. For example, the layers of the base reflective element 110 could be negatively doped.

The substrate element 170 could have a variety of compositions in order to satisfy process considerations, cost considerations, or some other criteria. For example, the substrate element 170 could include a bulk composed of GaAs. The substrate element 170 could additionally include other elements, e.g., a buffer layer composed of negatively-doped GaAs.

The electrodes 160a, 160b could have a variety of compositions. In some examples, one or both of the electrodes 160a, 160b could include metal in contact with a portion of the upper reflective element 140 or base reflective element 110, respectively. The composition of such a metal electrode could be tailored to the composition of underlying semiconductor material. For example, if the current-injection reflective layer comprises layers of positively-doped GaAs and $Al_xGa_{1-x}As$, the first electrode 160a could include gold and/or zinc. In another example, if the base reflective layer comprises layers of negatively-doped GaAs and $Al_xGa_{1-x}As$, the second electrode 160b could include gold, a germanium-gold alloy, and/or nickel.

Additionally or alternatively, the electrodes 160a, 160b could include a layer of semiconductor material disposed directly on the underlying material of the underlying upper reflective element 140 or base reflective element 110. This could be done, e.g., to reduce the contact resistance, reduce a voltage drop across the contact, to improve mechanical adhesion to the underlying material, or to provide some other benefit. In some examples, a low-bandgap material like GaAs, InGaAs, or some other material could be grown (e.g., via CVD, MOCVD, and/or MBE) on the underlying material to provide all or part of the electrode(s) 160a, 160b. The semiconductor material layer could be doped according to the underlying material, e.g., the current-injection reflective element 130 could be composed of positively-doped semiconductor materials and a layer of positively-doped GaAs or InGaAs could be part of the first electrode 160a. A metal layer could be disposed on the semiconductor material of the electrode(s) 160a, 160b. Alternatively, a wire-bond, spring contact, or other metallic contact could be placed into direct contact with the semiconductor material of the electrode(s) 160a, 160b.

The first DBR 140 includes a plurality of layers and/or layer-pairs, each layer-pair including two adjacent layers that differ with respect to composition and/or optical properties so as to function, in aggregate, as a DBR. For example, at least one layer-pair of the first DBR 140 could include a first layer having a GaAs composition and a second layer having an $Al_xGa_{1-x}As$ composition. The layers of the first DBR 140 could be doped to facilitate current flow from the first electrode 160a to the gain element 120 or to provide some other benefit. For example, the layers of the first DBR 140 could be positively doped.

The composition of the layer-pairs could vary from layer-pair to layer-pair, or could be substantially the same across all layer-pairs of the first DBR 140. This could be done, e.g., to facilitate the formation of the current-injection aperture 135 and the mode-selective aperture 155 such that they have different diameters. For example, a first portion 141a of the first DBR 140 could have a composition that differs from the composition of a second portion 141b of the first DBR 140. This difference in composition could result in one or more layers of the first portion 141a being more or less susceptible to an aperture-forming process (e.g., lateral oxidation) and/or a property of such a process than the second portion 141b. Accordingly, the current-injection aperture 135 and the mode-selective aperture 155 can be formed to have different diameters by using different aperture-forming processes and/or by applying the same process (e.g., a lateral oxidation process) at different process parameters (e.g., different temperatures. In such examples, if the current-injection reflective element 130 includes both the first portion 141a and part of the second portion 141b of the first DBR 140, the current-injection aperture 135 will only be incorporated into a subset of the layers of the first DBR 140 that are within the current-injection reflective element 130 (i.e., those layers of the first DBR 140 that are within the first portion 141*a* of the first DBR 140).

For example, the first portion 141*a* of the first DBR 140 could include a first alternating set of layers (including, e.g., layer 145*a*) having a GaAs composition and a second alternating set of layers (including, e.g., layer 147*a*) having an $Al_YGa_{1-Y}As$ composition. The second portion 141*b* of the first DBR 140 could include a first alternating set of layers (including, e.g., layer 145*b*) having a GaAs composition and a second alternating set of layers (including, e.g., layer 147*b*) having an $Al_XGa_{1-X}As$ composition, with the fraction X differing from the fraction Y. Accordingly, the susceptibility of the AlGaAs layers of the first portion 141*a* to a lateral oxidation process at a particular temperature differs from the susceptibility of the AlGaAs layers of the second portion 141*b* to the lateral oxidation process at the particular temperature. Accordingly, the diameters of the current-injection aperture 135 and the mode-selective aperture 155 may be set to different values by applying two different processes, e.g., by applying a first lateral oxidation at a first temperature and a second lateral oxidation at a second temperature.

Elements of an example process for fabricating such a VCSEL are illustrated in FIGS. 2A-E. FIG. 2A shows, in cross-section, a substrate 200 that can be formed into a VCSEL. The substrate 200 includes, from top to bottom, a first DBR 240, a gain element 220, a base reflective element 210 (e.g., a second DBR), and a bulk layer 270. The first DBR 240 includes a first portion 241*a* and a second portion 241*b* that differ from each other with respect to the composition of one or more layers thereof. The first portion 241*a* of the first DBR 240 has a first thickness.

FIG. 2B shows the substrate 200 after a mode-selective mesa 250 has been formed having a diameter of $d_4$. Forming the mode-selective mesa 250 includes etching at least a portion of the substrate 200 to a depth, $D_1$, that is less than the first thickness, such that the mode-selective mesa 250 does not include any of the second portion 241*b* of the first DBR 240.

FIG. 2C shows the substrate 200 after a mode-selective aperture 255 has been formed, in the mode-selective mesa 250, having a diameter of $d_3$. This aperture 255 may be formed by a variety of processes. For example, the mode-selective aperture 255 may be formed by lateral oxidation, at a first temperature, of $Al_XGa_{1-X}As$ in alternating layers of the mode-selective mesa 250 (with the other layers of the mode-selective mesa 250 being composed of a material that is not susceptible to the same applied lateral oxidation process, e.g., the other layers may be composed of GaAs). The aperture-formation process may affect all of the layers of the mode-selective mesa 250 or may only affect a subset of the layers (e.g., as shown in FIG. 2B).

FIG. 2D shows the substrate 200 after a current-injection mesa 230 has been formed having a diameter of $d_2$. Forming the current-injection mesa 230 includes etching at least a portion of the substrate 200 to a depth, $D_2$, that is greater than the first thickness. In an example (illustrated in FIG. 2D), the depth $D_2$ could be greater than a combined thickness of the first 241*a* and second 241*b* portions of the first DBR 240 and the gain element 220. Accordingly, the current-injection mesa 230 includes all of the second portion 241*b* of the first DBR 240 and some of the first portion 241*a* of the first DBR 240.

FIG. 2E shows the substrate 200 after a current-injection aperture 235 has been formed, in the current-injection mesa 230, having a diameter of $d_1$. This aperture 235 may be formed by a variety of processes. For example, the current-injection aperture 235 may be formed by lateral oxidation, at a second temperature, of $Al_YGa_{1-Y}As$ in alternating layers of the current-injection mesa 230 (with the other layers of the current-injection mesa 230 being composed of a material that is not susceptible to the same applied lateral oxidation process, e.g., the other layers may be composed of GaAs). The aperture-formation process may affect all of the layers of the current-injection mesa 230 or may only affect a subset of the layers (e.g., as shown in FIG. 2E).

In a particular example, alternating layers of the first portion 241*a* of the first DBR 240 could be composed of $Al_XGa_{1-X}As$ and alternating layers of the second portion 241*b* of the first DBR 240 could be composed of $Al_YGa_{1-Y}As$, with the fraction Y being greater than the fraction X. Accordingly, the alternating layers of $Al_XGa_{1-X}As$ will be less susceptible to lateral oxidation at a particular temperature than the alternating layers of $Al_YGa_{1-Y}As$. Thus, the mode-selective aperture 255 may be formed, as shown in FIG. 2C, by lateral oxidation at a first, higher temperature. The current-injection aperture 235 may be formed later, as shown in FIG. 2C, by lateral oxidation at a second temperature that is lower than the first temperature. Due to the second temperature being lower, the second lateral oxidation process will have less, or substantially no, effect on the diameter of the mode-selective aperture 255 and will instead act primarily to form the current-injection aperture 235. The diameters of the current-injection mesa 230 and the mode-selective mesa 250, the composition of the portions 241*a*, 241*b* of the first DBR 240, the first and second temperatures, first and second durations, or other properties of the first and second lateral oxidation processes, or some other characteristics of the VCSEL formation process could be specified in order to control the diameters of the mode-selective aperture 255 and the current-injection aperture 235.

A method for forming a VCSEL from the substrate 200 may include additional or alternative steps. For example, the method could include growing, via an epitaxial growth process, an amount of a low-bandgap, positively-doped semiconductor material (e.g., GaAs, InGaAs) on the current-injection mesa in order to form one or more electrodes on the current-injection mesa. Such a method could include additional or alternative methods for forming one or more electrodes, metallization, vias, passivation layers, or other structures of a VCSEL or other related systems on the same substrate as the formed VCSEL.

Note that the cylindrical nature of the illustrated current-injection mesas/layers and apertures and mode-selective mesas/layers and apertures are intended as non-limiting example embodiments. One or more of these elements could have an elliptical, triangular, square, or other cross-sectional shape according to an application.

Additionally, the word "diameter" is used throughout this disclosure to indicate a circular diameter of circular and/or cylindrical elements or features of VCSELs as described herein. It should be understood that these uses are intended to describe non-limiting example embodiments and that the term "diameter," as used herein, is intended to broadly describe a characteristic size (e.g., a mean cross-sectional dimension, a maximum cross-sectional dimension) of apertures or other features having any shape. For example, where a current-injection reflective layer or mesa has a square cross-section, the "diameter" of such a current-injection reflective layer or mesa could be measured as the length of a side of the square, a diagonal dimension of the square, or some other characteristic dimension of the square.

II. EXAMPLE METHODS

Figure 3:
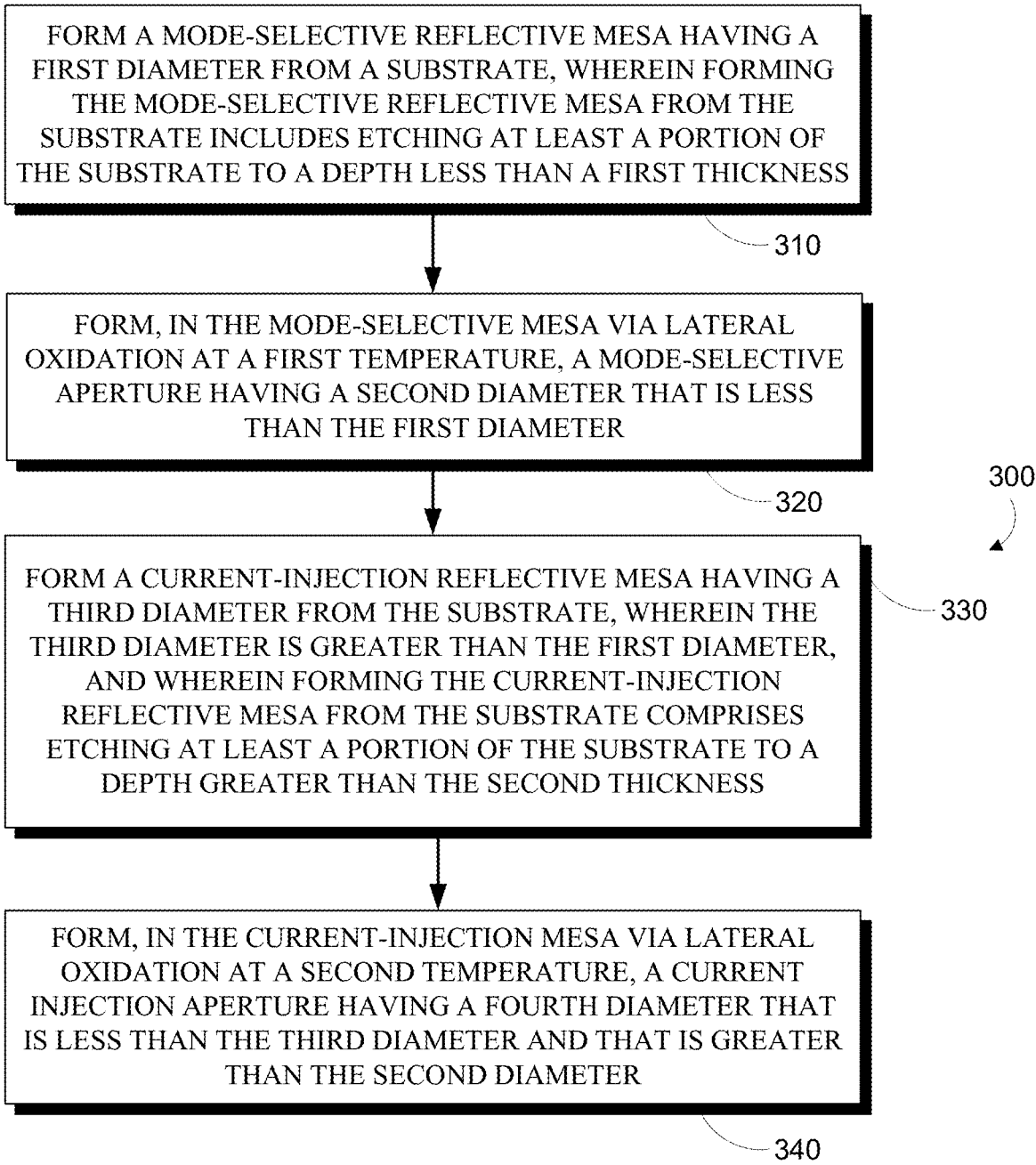
FIG. 3 is a flowchart of a method, according to an example embodiment.

FIG. 3 is a flowchart of a method 300 for fabricating a vertical-cavity surface-emitting laser. The method 300 includes forming a mode-selective reflective mesa having a first diameter from a substrate, wherein forming the mode-selective reflective mesa from the substrate includes etching at least a portion of the substrate to a depth less than a first thickness (310). The substrate includes: (i) a base reflective element; (ii) a gain element; (iii) a first upper reflective element having the first thickness, wherein the first upper reflective element comprises at least one layer-pair of a DBR having a first composition, and wherein the gain element is disposed within the substrate between the base reflective element and the first upper reflective element; and (iv) a second upper reflective element, wherein the second upper reflective element comprises at least one layer-pair of a DBR having a second composition that differs from the first composition, and wherein the second upper reflective element is disposed within the substrate between the gain element and the first upper reflective element.

The method 300 additionally includes forming, in the mode-selective mesa via lateral oxidation at a first temperature, a mode-selective aperture having a second diameter that is less than the first diameter (320). The method further includes forming a current-injection reflective mesa having a third diameter from the substrate, wherein the third diameter is greater than the first diameter, and wherein forming the current-injection reflective mesa from the substrate comprises etching at least a portion of the substrate to a depth greater than the second thickness (330). The method 300 yet further includes forming, in the current-injection mesa via lateral oxidation at a second temperature, a current injection aperture having a fourth diameter that is less than the third diameter and that is greater than the second diameter (340). The method 300 could include additional elements or features.

III. EXPERIMENTAL RESULTS

Short-haul optical links based on 850 nm wavelength optical transceivers and multimode fibers (MMF) are widely deployed in large-scale data communication applications. The insertion of quantum-wells into semiconductor diode lasers and the development of oxide-confined apertures for low threshold (<1 mA) make multimode (MM) oxide-VCSELs a practical laser source for energy-efficient error-free transmission up to 57 Gb/s. 57 Gb/s error-free data transmission of such devices at room temperature (RT) have been achieved. Increases in temperature can result in bandwidth reduction in such devices. As a result, the highest error-free data rate achieved in such a device at 85° C. is 50 Gb/s. 25 Gb/s per-channel MM 850 nm oxide-VCSELs-based optical links reaching up to 100 meter over MMF operated up to 70° C. are in production by Broadcom, Finisar, and others.

However, modal and chromatic dispersions in MMF can limit the bit rate over distance and across operational temperature ranges. For transmission across distances of over 100 m, the modal dispersion in MMF over distance can be compensated-for by using single-mode (SM) VCSELs. Such SM-VCSELs may be created by employing small oxide aperture or surface-relief etch filter to achieve side-mode suppression ratio (SMSR) >30 dB. Such SM-VCSELs can extend the MMF reach up to 500 m @ 30 Gb/s and 1 km @ 25 Gb/s for error-free transmission. This disclosure provides improved single-mode oxide-VCSELs, and methods for fabricating such improved VCSELs, that exhibit stable 850 nm single-mode operation. This is achieved by including, in the VCSEL, a mode-selective filter (MSF) to achieve ITH~0.7 mA, Pout >2.1 mW, and SMSR >33 dB at an operating bias current of I=6 mA. These VCSELs successfully deliver 32 Gb/s (at room temperature (RT)) and 26 Gb/s (at 85° C.) error-free transmission (BER <10-12 with at least 10 Tb data transmitted for up to 99.995% confidence level) in 500 m OM4 MMF fiber, and 28 Gb/s (at RT) and 22 Gb/s (at 85° C.) in 1 km OM4 MMF fiber, without any use of pre-emphasis or error-correction techniques.

Multi-mode oxide-Aperture Confined VCSELs are a low-cost light source that can be applied for short haul optical data links using a multimode fiber (MMF) up to 25 Gb/s. However, due to such VCSELs outputting significant power at multiple different modes, the signal integrity and dispersion (measured, e.g., as signal/noise ratio and Bit Error Rate) are degraded over distance (e.g., preventing substantially error-free transmission at distances greater than 150 meters). These dispersive effects can be attributed to a variety of factors, including differences in the rate change of photon energy in each laser mode and mismatches in the coupling efficiency of the different VCSEL output modes into multi-modes fiber (MMF). To improve the signal integrity of VCSEL-generated optical transmissions over distance, single mode VCSELs as described herein may be fabricated and employed to generate such optical transmissions.

A traditional VCSEL that includes a large oxide aperture (e.g., greater than 3 microns in diameter) may be modified so as to engage in single-mode emission by, e.g., including surface relief etching, incorporating an extended monolithic optical cavity, using ion implantation to form the oxide-VCSEL, incorporating a photonic crystal, or incorporating a pattern antiphase filter. However, these methods may result in increased laser threshold, lower bandwidth, higher $R_{IN}$ noise, and/or lower data rate operation, may require multiple additional process steps which may hamper high yield manufacturing, or may result in additional or alternative unwanted effects or costs.

A VCSEL may be made to emit light according to a single-mode by reducing the oxide aperture diameter to below a threshold diameter, e.g., less than 3 microns. However, injecting current through such a small aperture can cause an increased series resistance of the VCSEL. This can result in an impedance mismatch for RF signal input, increased beam divergence, lower laser power, or other unwanted effects which may limit high-speed operation and optical efficiency. Additionally, the fabrication of a uniform and reproducible single-mode VCSEL may require the use of difficult-to-control oxidation processes.

The present disclosure provides a new device structure for top emission VCSELs. This new device structure may be fabricated via a self-aligned partially selective oxidation device process. Top emission VCSELs with this novel structure can achieve single transverse mode emission and 300 m distance 25 Giga Bit Per Second (GBPS) transmission data rate operation. The present disclosure demonstrates a new type of VCSEL that can be employed to achieve long distance (300 m) high data rate (25 Gbps) single channel optical transmission.

Such stable single-mode 850 nm oxide-confined VCSELs with integrated mode-selective filter were developed and have demonstrated record performance of 32 Gb/s (RT) and 26 Gb/s (85° C.) error-free transmission over extended distance of 500 m OM4 multimode fiber, as well as 28 Gb/s (RT) and 22 Gb/s (85° C.) up to 1 km. With the improvements provided by the single-mode VCSEL bandwidth, it is expected that the >25 Gb/s error-free transmission may be possible at over 1 km and at device operating temperatures up to 85° C.

Device Structure and Fabrication Process

The 850 nm VCSEL epi-growth structure used in this work is a standard one-wavelength length active region design grown by Epiworks. The VCSEL structures include: (i) an active region that includes 3 GaAs/$Al_{0.2}Ga_{0.8}As$ multi-quantum-wells and a $Al_{0.3}Ga_{0.7}As$ cladding layer, (ii) a 20 layer-pair $P^+$-DBR and a $P^+$-GaAs cap layer on the top, (iii) a 34 layer-pair $N^+$-DBR, and (iv) an $N^+$-GaAs buffer and semi-insulated GaAs substrate at the bottom. The $P^+$-DBR and $N^+$-DBR include carbon and silicon doped $Al_{0.9}Ga_{0.1}As/Al_{0.12}Ga_{0.88}As$. Between the $P^+$-DBR and the active region, there is a 30 nm+30 nm $P^+$-AlAs+$P^+$-$Al_{0.9}Ga_{0.1}As$ layer as a current confinement layer.

The oxide-VCSELs were fabricated using a VCSEL process developed by UIUC-HSIC Feng group with a 14 µm diameter mesa and an oxide aperture of 5 µm by placing a p-ohmic contact on top of a P+ cap above a 20 layer-pair DBR. The L-I-V characteristics of such a VCSEL are shown FIG. 16, with a low threshold $I_{TH}$=0.45 mA and a differential resistance of 153 ohm @ 2 mA and 60 ohm @ 5 mA. The device optical spectrum indicates a multimode operation @ 2 mA and above.

The present disclosure demonstrates a single mode oxide-VCSEL with a low threshold, increased bandwidth, and demonstrated 25 Gb/s error-free transmission that can extend transmission distance in MM4 fiber from 100 meter to 300 meter in MMF4.

Figure 4:
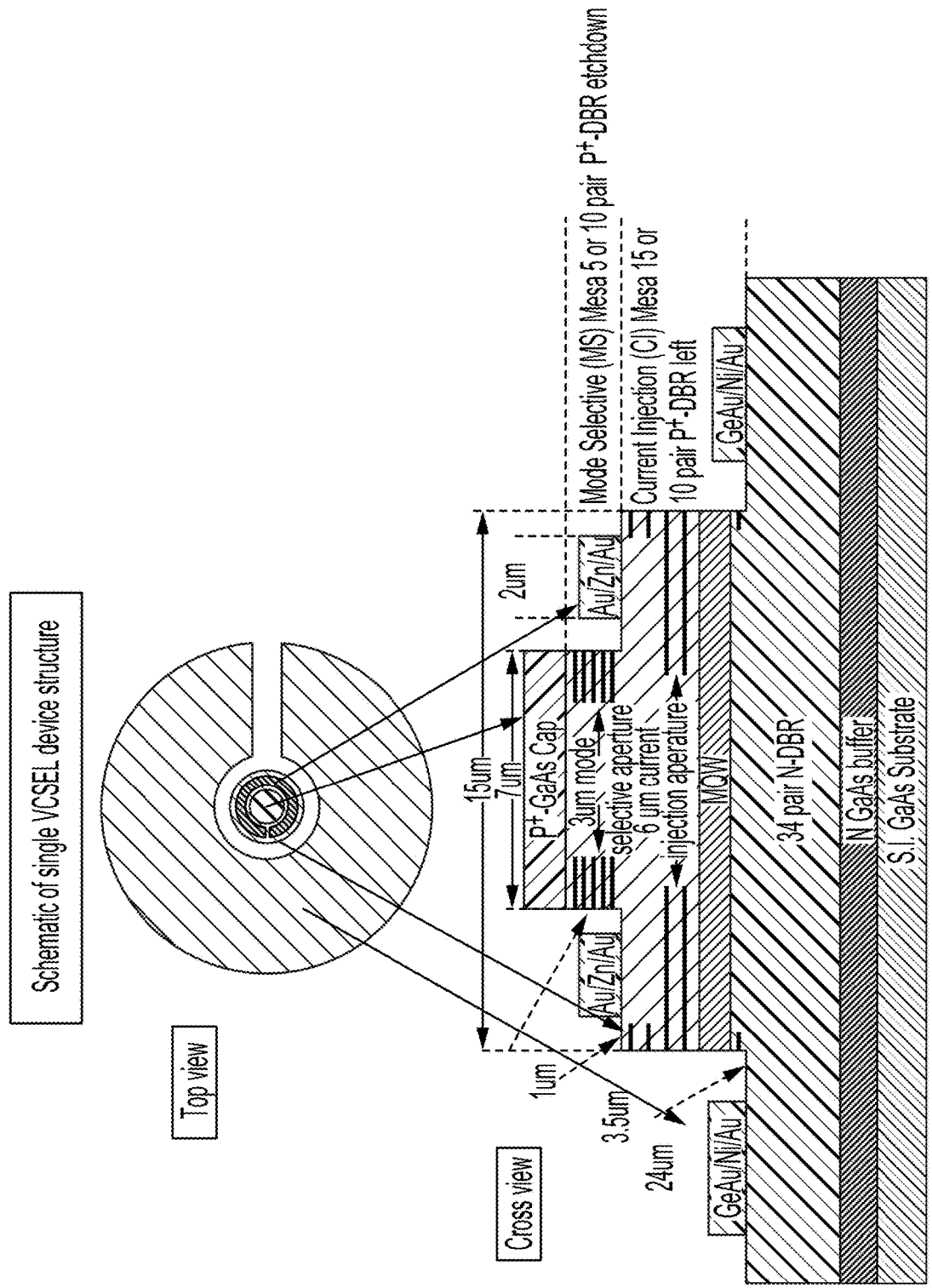
FIG. 4 is a cross-sectional and above view of an example VCSEL.
Figure 5:
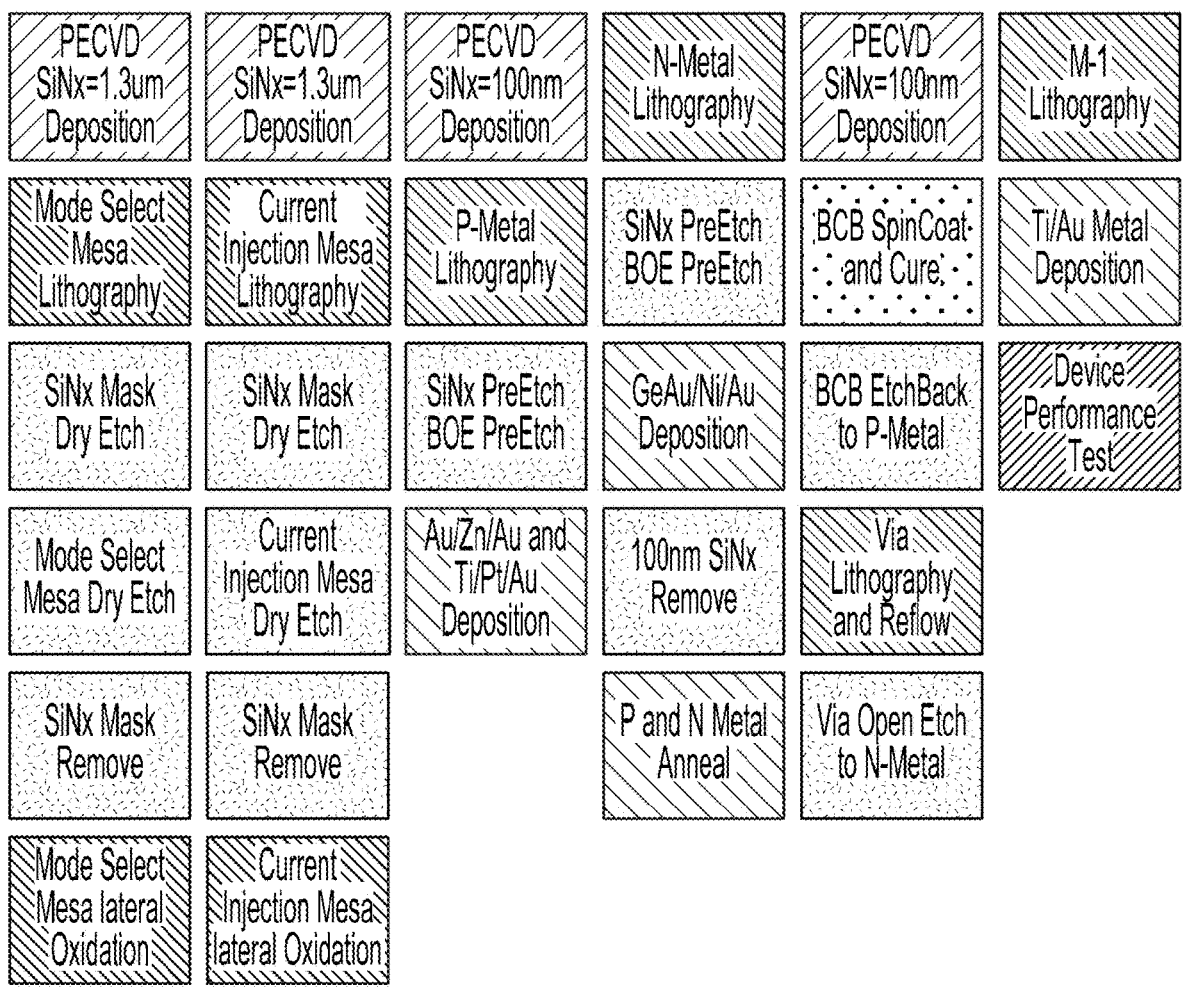
FIG. 5 illustrates elements of an example process for forming a VCSEL.

FIG. 4 shows a schematic of the device structure of a single-mode VCSEL (SM-VCSEL) as described herein. FIG. 5 illustrates example processes for fabricating such a device, and FIG. 6 shows scanning electron micrographs of devices formed according to such processes, the illustrated devices differing with respect to the thickness/number of DBR layer-pair included in the upper "mode selective" mesa of the SM-VCSEL.

As shown in FIG. 6, this SM-VCSEL device contains two mesas—a mode selective (MS) mesa (the upper, narrower mesa) and an ohmic contact low resistance "current injection" (CI) mesa (the lower, wider mesa). Both mesas are disc-shaped and concentric and have diameters of 7 µm and 15 µm for the upper and lower mesas, respectively.

The process flow for the SM-VCSEL fabrication is demonstrated in FIG. 5. The MS mesa is defined by contact lithography and dry etching, then the sample is sent to a tube furnace for lateral oxidation where $Al_{0.9}Ga_{0.1}As$ is oxidized to $Al_{0.9}Ga_{0.1}O_x$. The lateral oxidation length is 2 µm±1, so there is 3 µm±1 µm mode selective aperture left in the center of the MS mesa. The oxidation rate is isotropic and uniform, so the MS aperture is located in the center of the mesa. Compared to other mode select methods, such as proton implantation, photonic crystal, or Zn disordered, this method is a self-aligned strategy.

The lower mesa is defined by a similar process, which is followed by a thermal oxidation to form a current injection aperture with 5 to 6 µm diameter. Because the AlAs oxidation temperature is lower than that of $Al_{0.9}Ga_{0.1}As$, the second-round oxidation does not significantly affect the MS aperture size. The diameter of the CI aperture is smaller than the diameter of the MS mesa, in order to reduce optical leakage.

The CI aperture size is larger than that of traditional single mode VCSEL (which is, generally, less than 3 µm). This larger aperture size facilitates low series resistance and high levels of optical output power. The SM aperture is set to 3 µm for single mode operation, substantially allowing only the fundamental mode of the laser pass through the aperture and reflecting higher mode light back to the active region. This optical mode selection strategy opens a new avenue to reach high power single-mode operation while also allowing for high speed modulation.

The P-metal (Au/Zn/Au+Ti/Au) is deposited on the $P^+$-DBR layer of the CI mesa. In some embodiments, this connection can be improved by the reducing the number of DBR layer-pairs under the ohmic metal. One potential advantage of this structure is the reduction of the series resistance, because the P-metal is closer to the active region relative to the location of traditional contact metal which is on the very top of the $P^+$-GaAs cap layer.

The N-Metal (GeAu/Ni/Au), device planarization, via opening, and contact pad are fabricated in sequence. In FIG. 6, scanning-electron microscope (SEM) images show the single device structures with 5 and 10 pair $P^+$-DBR etchdown. The etch-down process between 1 to 10 pairs can be optimized to adjust the quality factor or "Q" of the higher order modes in order to achieve low threshold and higher bandwidth operation while the fundamental mode has the highest Q such that the device operates in a substantially single-mode operation.

Device Performance

In FIGS. 7-10, the L-I-V, emission spectrum, bandwidth, and bit error rate for transmission of data are demonstrated. The 5 pair P+-DBR etchdown device demonstrates a single mode operation with around 2 mW output power, 16 GHz bandwidth, and BER up to 25 Gbps with 300 meter OM-4 fiber transmission length. The 10 Pair P+-DBR etchdown device demonstrates a more pure single mode spectrum with around 0.5 mW output power, 12 GHz bandwidth, and BER up to Gbps with 300 meter OM-4 fiber transmission length.

Figure 7A:
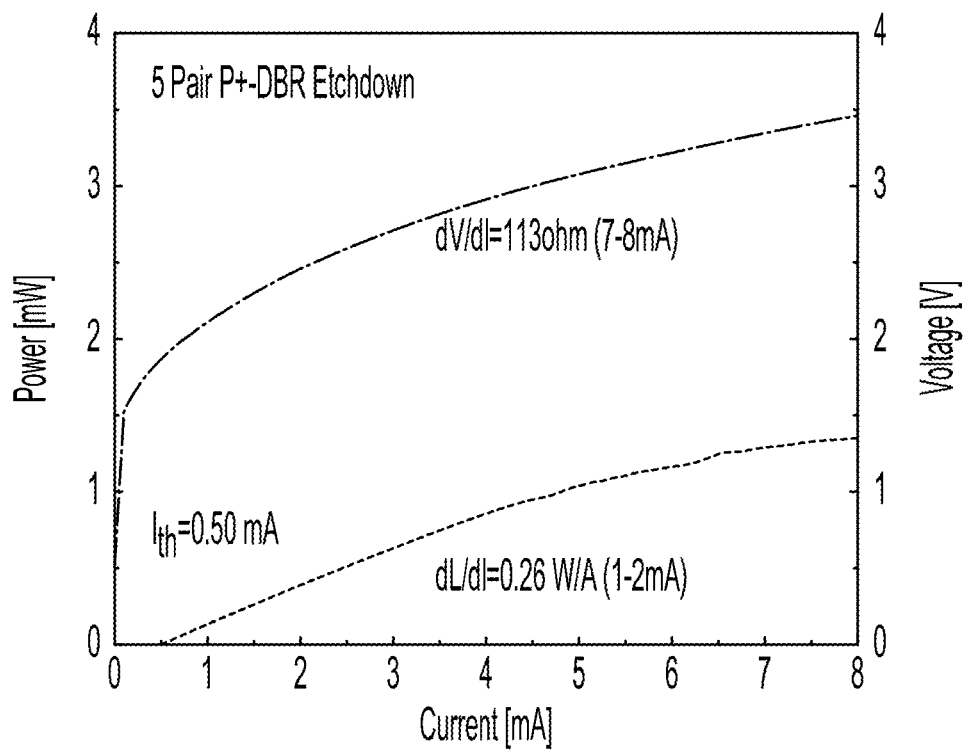
FIG. 7A illustrates optical output power and voltage versus device injection current 5 for an example VCSEL.

FIG. 7A illustrates the optical output power and voltage versus device injection current for the 5 pair P+-DBR etchdown device.

Figure 7B:
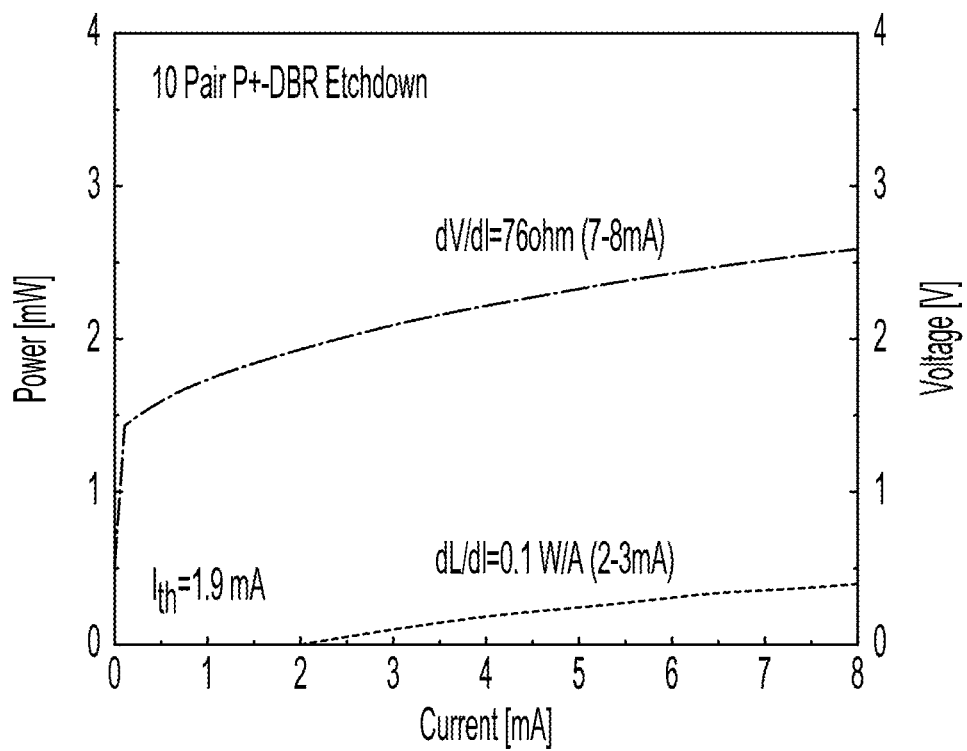
FIG. 7B illustrates optical output power and voltage versus device injection current 5 for an example VCSEL.

FIG. 7B illustrates the optical output power and voltage versus device injection current for the 10 pair P+-DBR etchdown device.

Figure 8A:
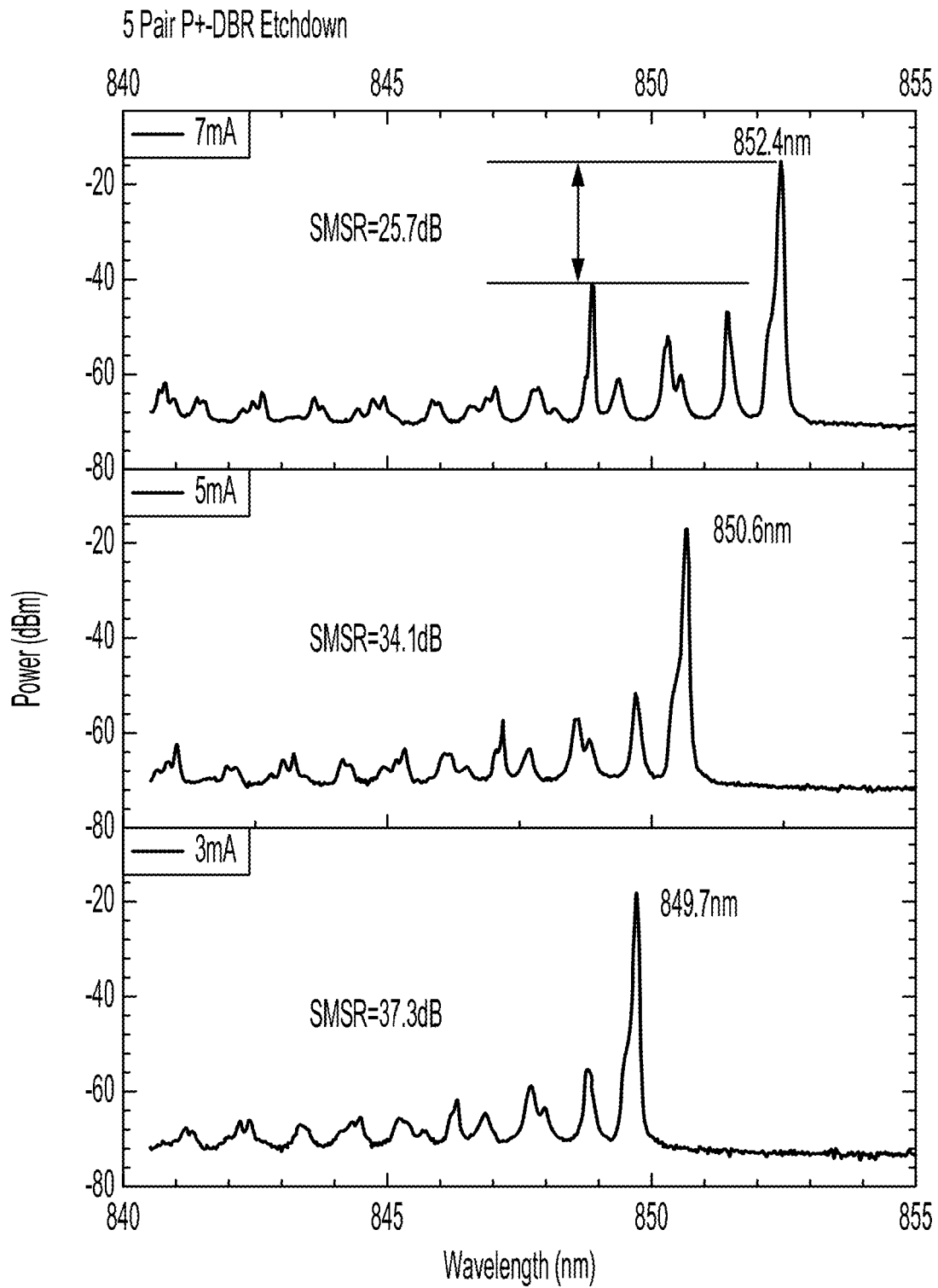
FIG. 8A illustrates emission spectra versus device injection current for an example VCSEL.

FIG. 8A illustrates the emission spectra versus device injection current for the 5 pair P+-DBR etchdown device.

Figure 8B:
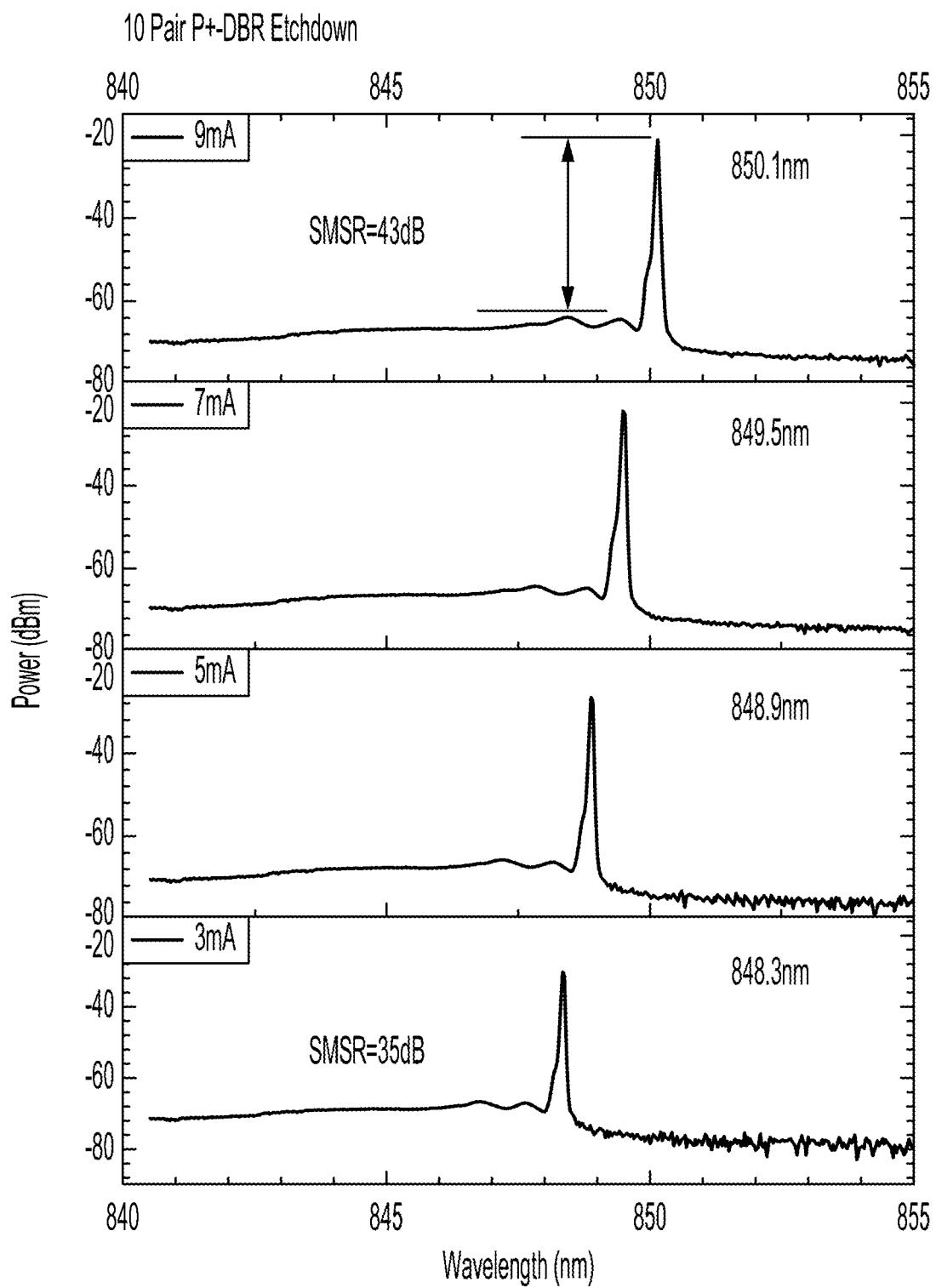
FIG. 8B illustrates emission spectra versus device injection current for an example VCSEL.

FIG. 8B illustrates the emission spectra versus device injection current for the 10 pair P+-DBR etchdown device.

Figure 9A:
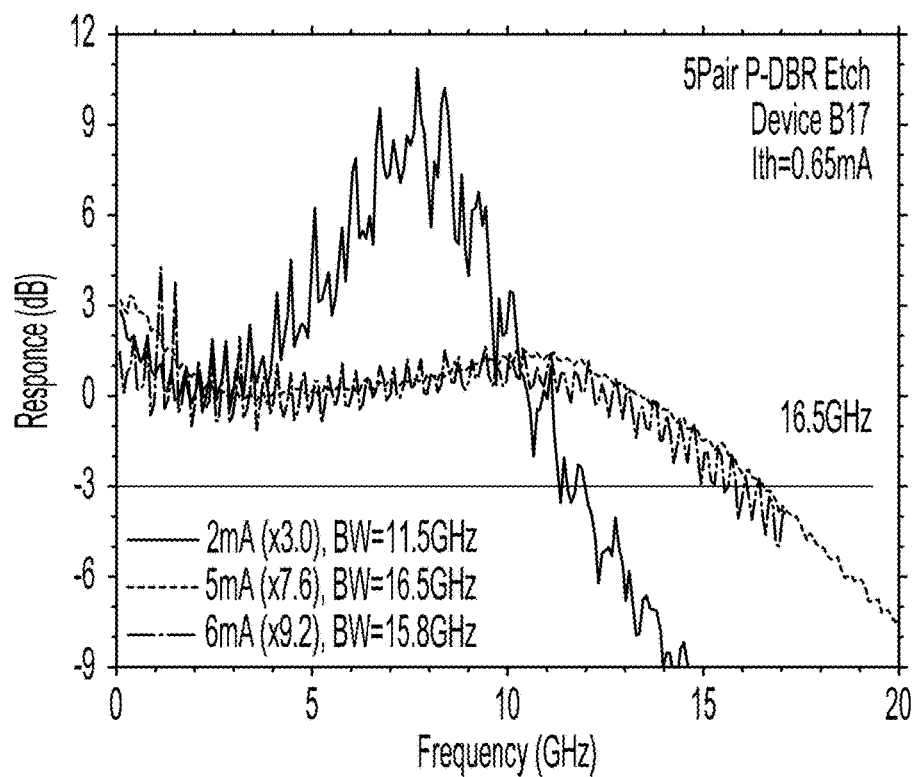
FIG. 9A illustrates the frequency response of an example VCSEL.

FIG. 9A illustrates the frequency response of the 5 P+-DBR etchdown device.

Figure 9B:
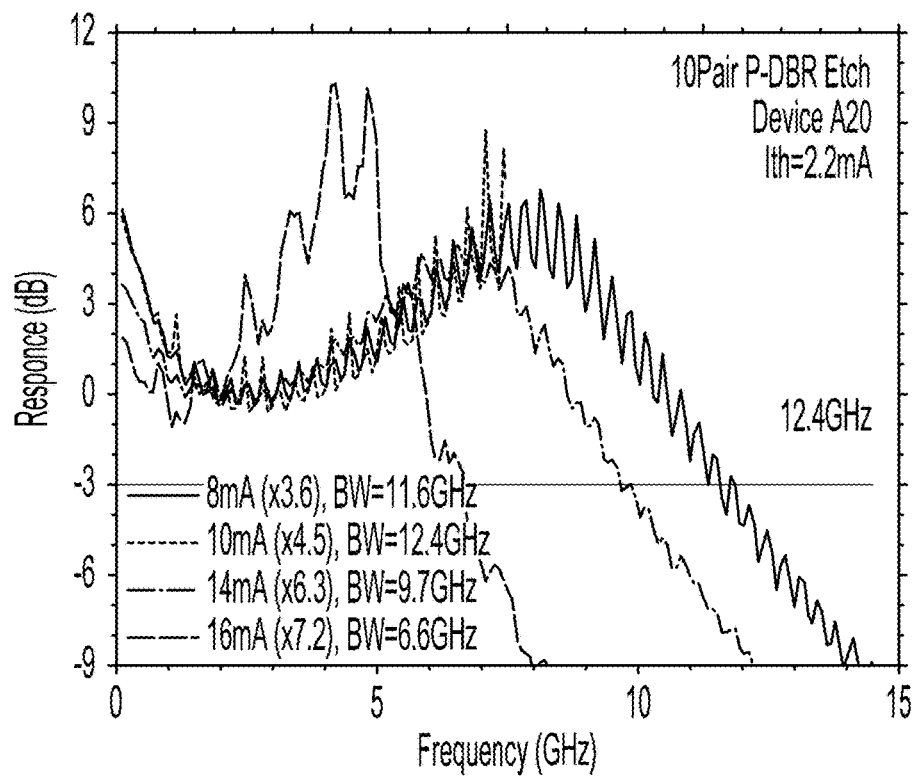
FIG. 9B illustrates the frequency response of an example VCSEL.

FIG. 9B illustrates the frequency response of the 10 P+-DBR etchdown device.

Figure 10A:
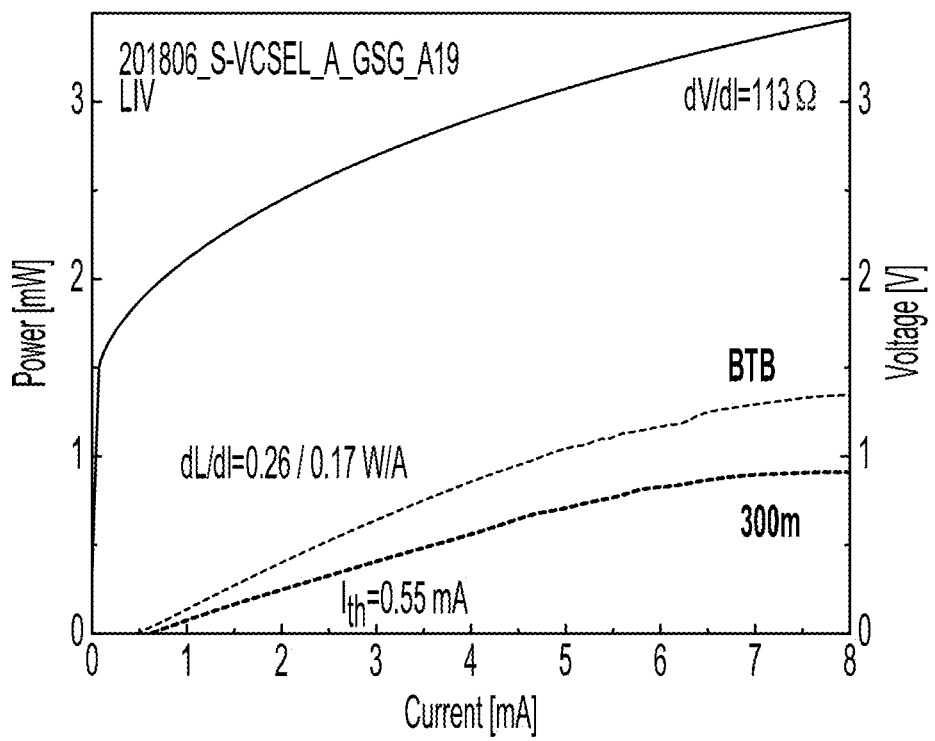
FIG. 10A illustrates properties of an example VCSEL versus current.

FIG. 10A illustrates the performance of a high speed VCSEL with $I_{TH}$~0.55 mA. An L-I-V test for BTB (3 meter OM4 fiber) and 300 meter OM4 fiber (dashed line) is shown. At this level, the fundamental mode (1,1) at 852.06 nm is SMSR=29.1 dB higher than 2nd order mode of (2,1) at 851.06 nm. Thus, the VCSEL was performing substantially in the single mode operation.

Figure 10B:
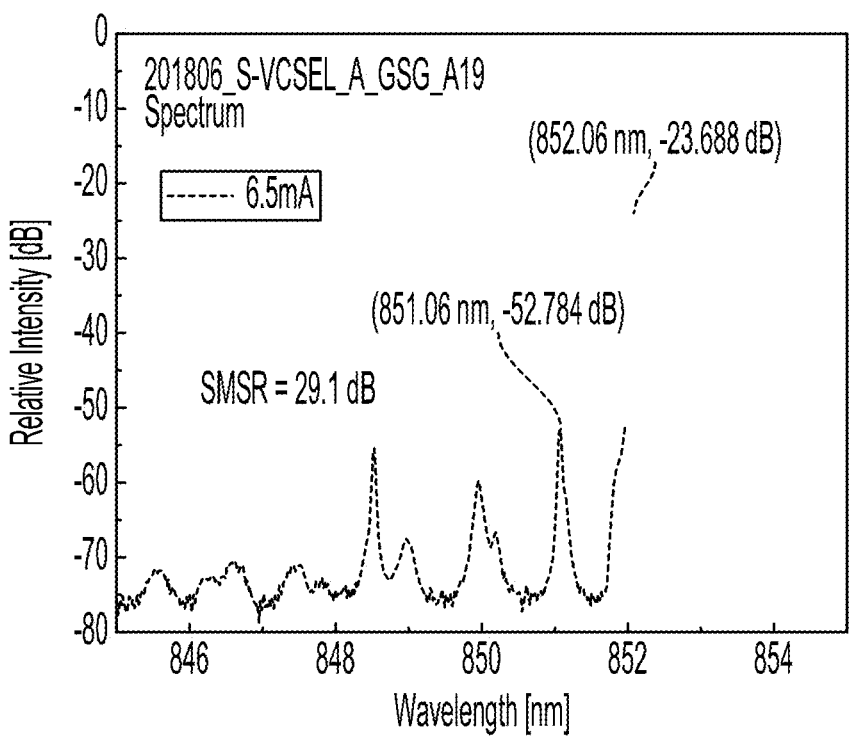
FIG. 10B illustrates properties of an example VCSEL versus current.

FIG. 10B illustrates the performance of a high speed VCSEL with $I_{TH}$~0.55 mA. An L-I-V test for optical spectrum @ I=6.5 mA WI$_{TH}$=12) is shown for a high speed 26 Gb/s test.

VCSEL High-Speed Characteristics

The optical microwave small-signal analysis was performed on the device using an Agilent E8364B 50 GHz PNA Network Analyzer with 2-port calibration: the electrical microwave signal from the port 1 of PNA was combined with a DC bias through an SHF BT65 65 GHz broadband bias tee, and the coupled optical output is relayed into a New Focus 1414-50 25 GHz multimode photodetector. The converted electrical signal from the photodetector was fed into the port 2 of the PNA. In order to reduce the peaking effect and the bandwidth limitation of the photodetector, the frequency response of the photodetector was corrected out of the measured frequency response of the device.

Figure 11A:
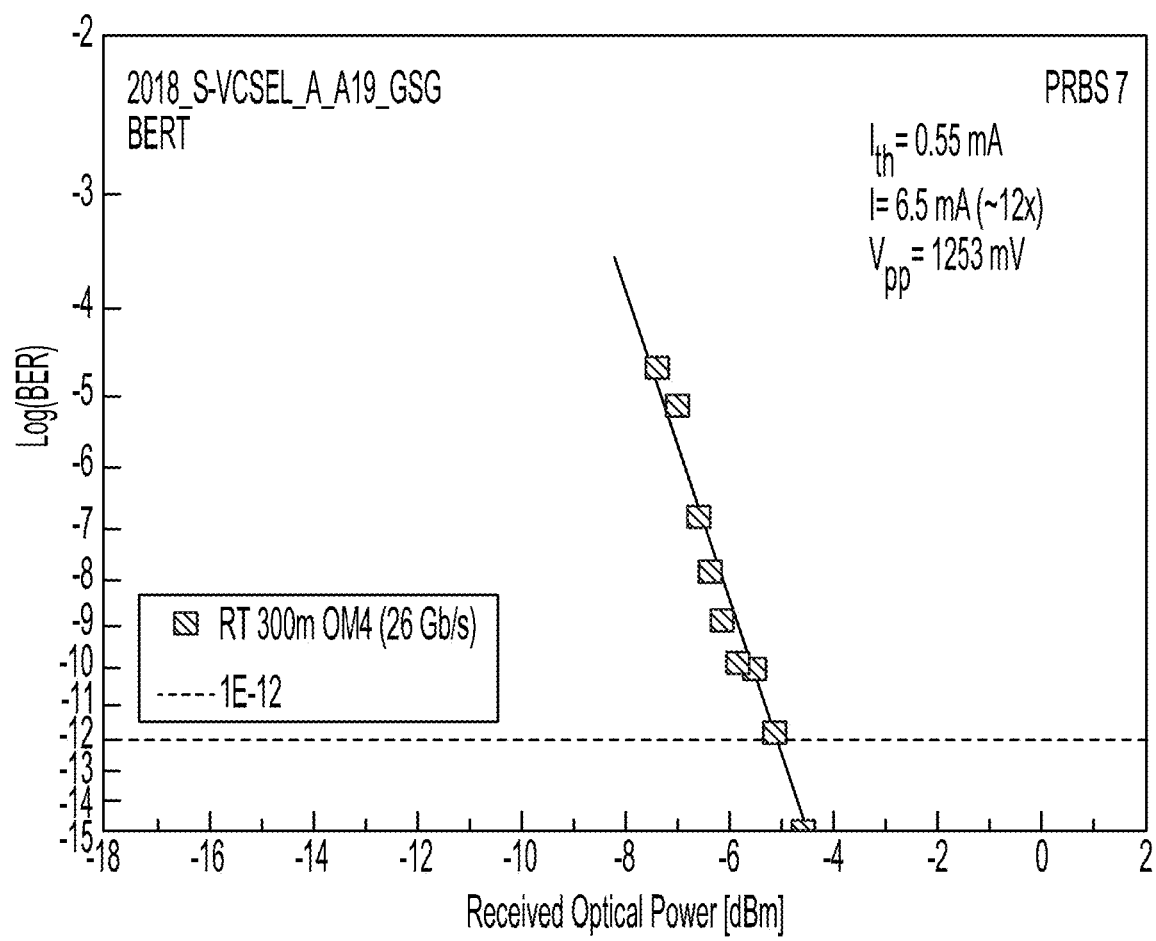
FIG. 11A illustrates data transmission properties of an example VCSEL.

FIGS. 11A and 11B show the performance of a single mode oxide-VCSEL when used to transmit 26 Gb/s error-free data transmission through 300 m of OM4 fiber @ $I_{TH}$=6.5 mA. The BERT passed at −0.3 mW. Low power with a large Vpp was used to increase OMA. This resulted in a small but satisfactory eye.

Figure 12:
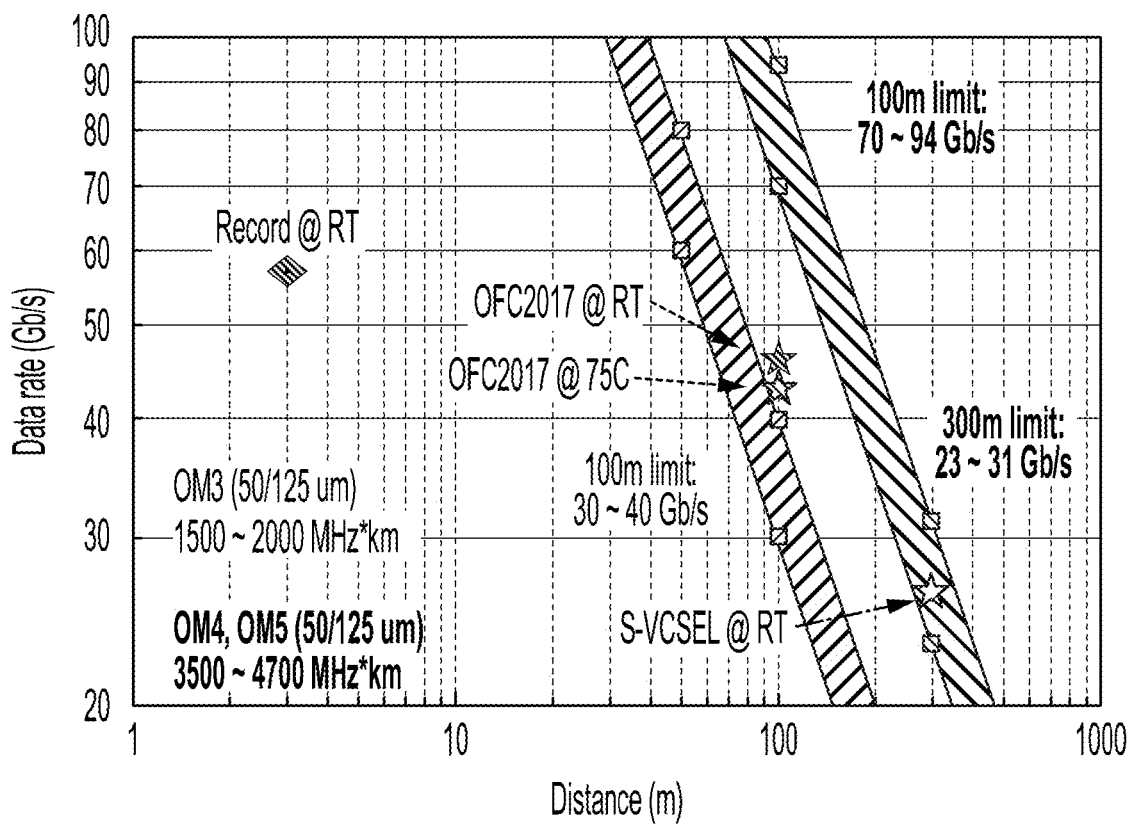
FIG. 12 illustrates data transmission properties of an example VCSEL.

FIG. 12 illustrates the bandwidth limits for a particular implementation of the single mode VCSEL described herein. FIG. 12 demonstrates possible bounds on bandwidth using such a VCSEL to transmit through 300 m of OM4 fiber: between 23.3 Gb/s (worst launch condition) and 31.1 Gb/s (best-case); 26 Gb/s is already in the fiber-limited regime. For comparison, a typical commercial 25 Gb/s VCSEL (see Finisar) is limited to 100 meters.

Figure 13B:
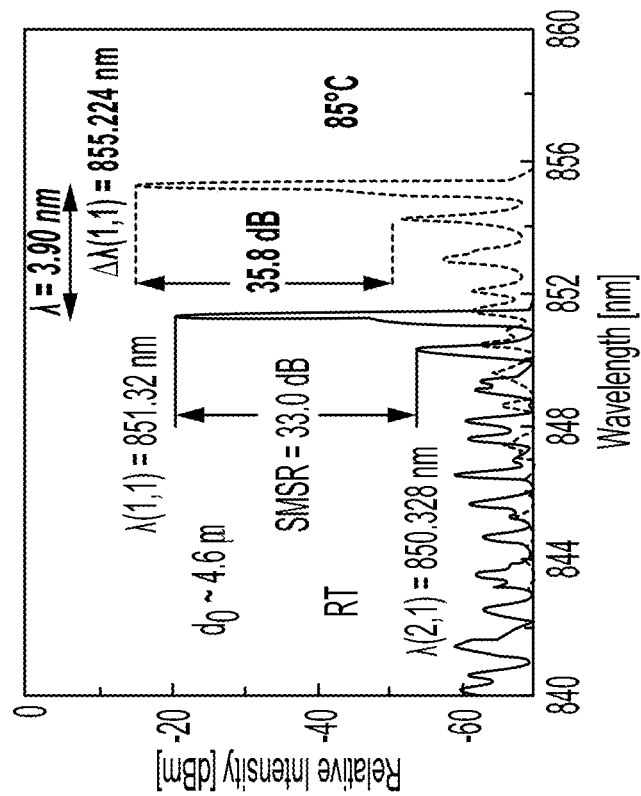
FIGS. 13A and 13B illustrate L-I-V characteristics and the optical spectrum of an example VCSEL.
Figure 13A:
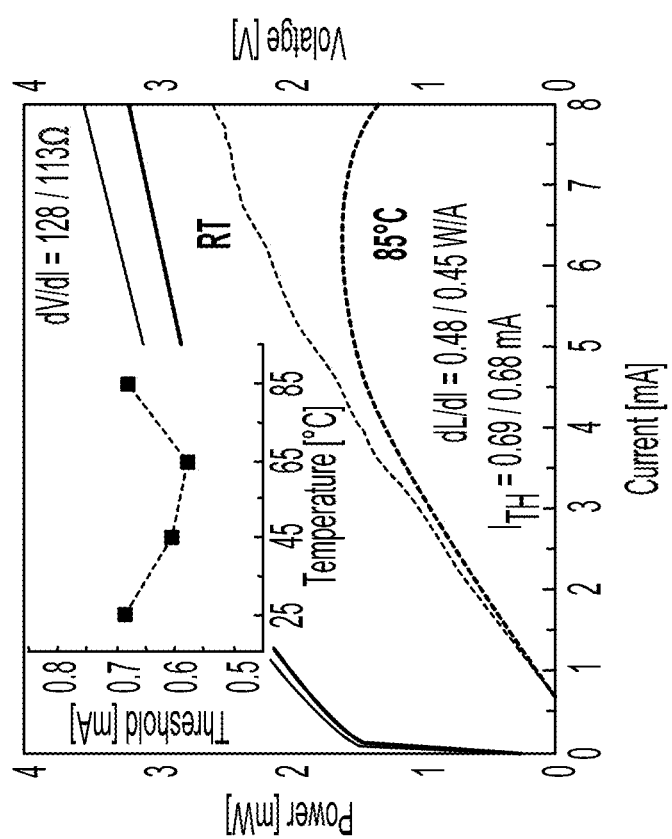

FIG. 13 illustrates (a) L-I-V characteristics of the 850 nm single-mode oxide-confined VCSEL with integrated mode-selective filter (MSF) at RT (~25° C.) and at 85° C. The threshold current $I_{TH}$=0.69 mA (RT) and 0.68 mA (85° C.) due to a detuned cavity design. The optical conversion efficiency is around 0.48 W/A (RT) and 0.45 W/A (85° C.). FIG. 13 also illustrates (b) the optical spectrum at RT (black) and 85° C. (red) of the VCSEL at biasing current I=6 mA. The optical aperture is estimated to be 4.6 The integrated MSF is effective to suppress all higher modes to achieve SMSR >33 dB over a range of currents from the bias current up to 8 mA and a temperature range up to 85° C.

Figure 14B:
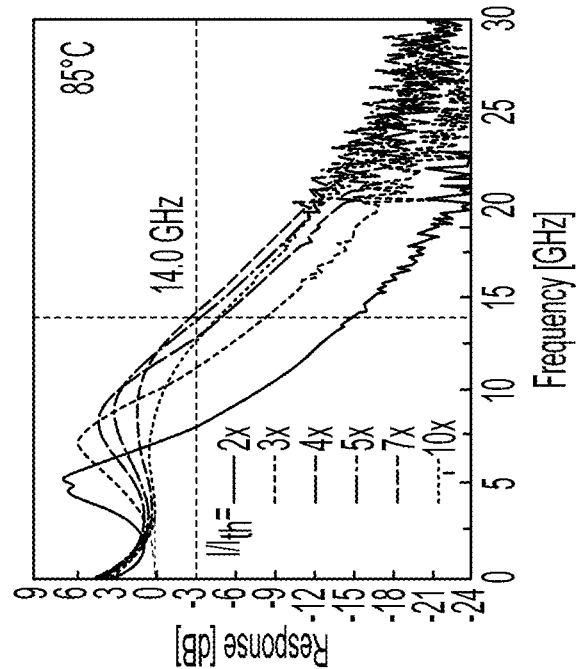
FIGS. 14A and 14B illustrate the optical response of an example VCSEL at room temperature and at 85 degrees Celsius.
Figure 14A:
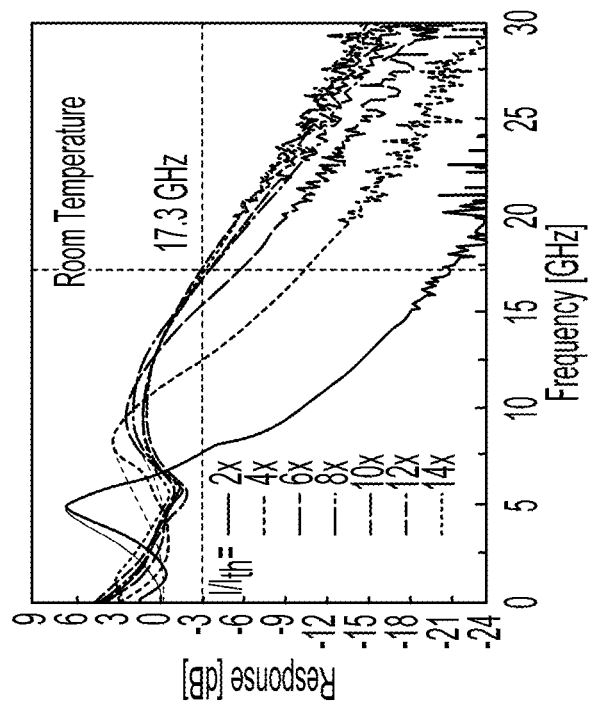

FIG. 14 shows the optical response (solid lines) and the fittings of data (dotted lines) at various bias currents above the laser threshold for the 4.6 μm aperture VCSEL at (a) RT and (b) 85° C. The highest −3 dB bandwidth is 17.3 GHz (RT) and 14 GHz (85° C.) respectively.

As shown in FIG. 14, the highest −3 dB bandwidth of the VCSEL records at 17.3 GHz at RT and 14 GHz at 85° C., which decreases as the temperature increases. The decrease of bandwidth can affect the high temperature error-free data transmission speed, and as a good rule of thumb the maximum data rate for back-to-back (BTB) transmission is 2 times the highest bandwidth, which gives an estimated performance of around 34 Gb/s at RT and 28 Gb/s at 85° C.

Figures 15A, 15B:
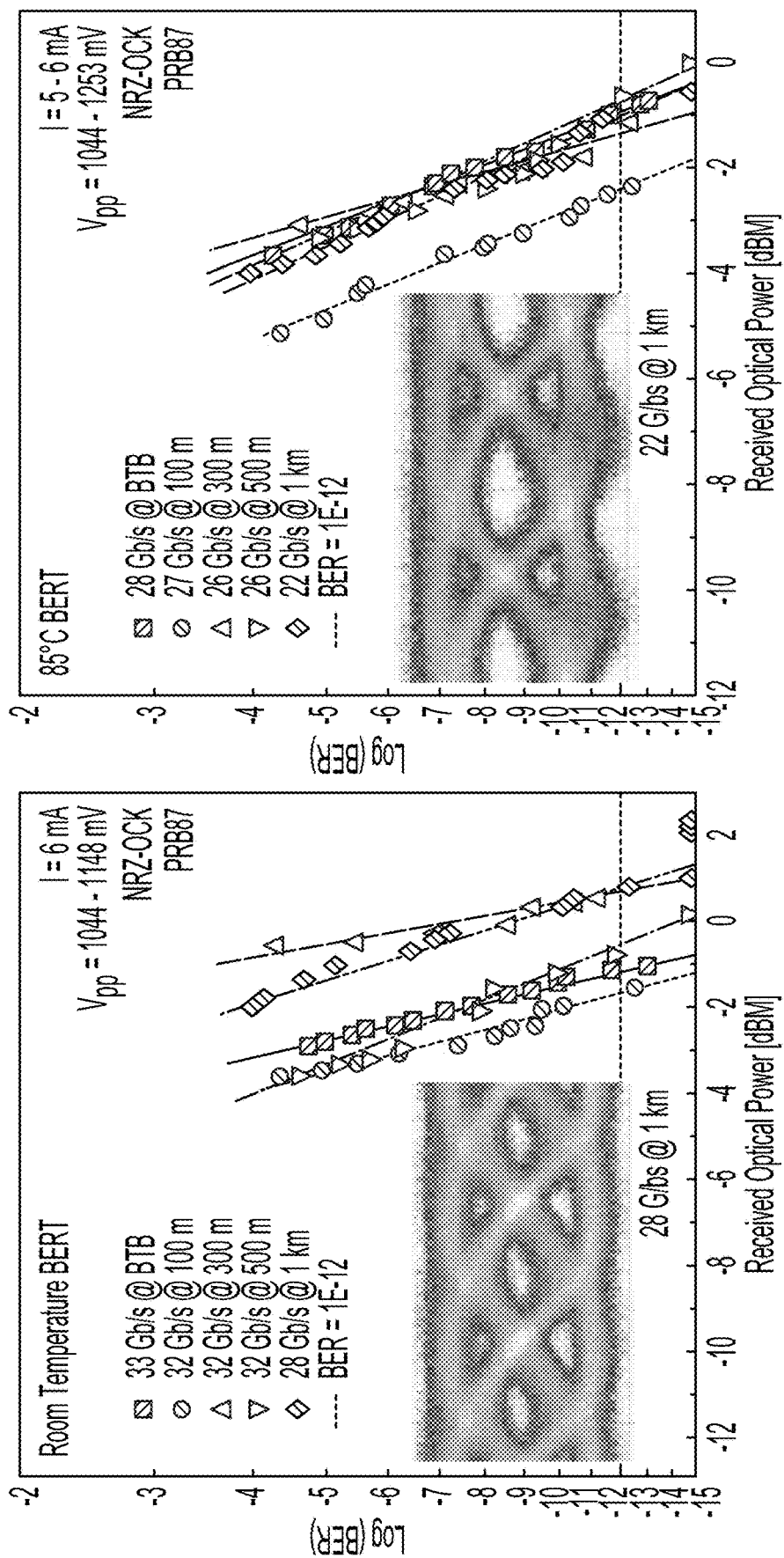
FIGS. 15A and 15B illustrate data transmission characteristics of an example VCSEL at room temperature and at 85 degrees Celsius.

FIG. 15 shows (a) BERT at RT (33 Gb/s over BTB, 32 Gb/s over 100, 300, and 500 m, and 28 Gb/s over 1 km OM4 MMF) versus received optical power for the optical link based on the 4.6 μm optical aperture single-mode VCSEL. FIG. 15 also shows (b) 85° C. BERT (28 Gb/s over BTB, 27 Gb/s over 100 m, 26 Gb/s over 300 and 500 m, and 22 Gb/s over 1 km OM4 MMF) for the same single-mode VCSEL device.

FIG. 16 shows the L-I-V of a VCSEL made using traditional techniques with a low threshold $I_{TH}$=0.45 mA, a differential resistance of 153 ohm @ 2 mA and 60 ohm @ 5 mA. The device spectrum indicates a multimode operation @ 2 mA and above.

RT and 85° C. bit-error-rate testing (BERT) results and eye diagrams of a high-speed oxide-confined single-mode VCSEL as described herein are shown in FIG. 6, without using pre-emphasis or error-correction techniques. The test bit sequence is a non-return-to-zero (NRZ) 27-1 pseudorandom binary sequence (PRBS7) generated by the SHF 12103A bit pattern generator. The optical output is coupled into a 2 m long (BTB) OM4 MMF and converted to electrical signal through a New Focus 1484-A-50 22 GHz high gain photoreceiver. A Keysight 86100C DCA-J oscilloscope with a 70 GHz sampling module is used to capture the eye diagrams, and a SHF 11104A error analyzer is used to perform BERT. A free-space neutral density filter is used to attenuate the received optical power to characterize the BER as a function of optical power. The high-speed oxide-confined single-mode VCSELs have demonstrated stable performance up to 85° C. for extended distance up to 1 km. At RT, the SM-VCSEL shows error-free transmission over OM4 MMF of various distances at 33 Gb/s (BTB), 32 Gb/s (100, 300, and 500 m), and 28 Gb/s (1 km); at 85° C., error-free transmissions are demonstrated at 28 Gb/s (BTB), 27 Gb/s (100 m), 26 Gb/s (300 and 500 m), and 22 Gb/s (1 km), all without pre-emphasis or error-correction.

The below table summarizes these results:

|  | $I_{TH}$ | dV/dI (7-8 mA) | dL/dI | Max output power | SMSR | Bandwidth | BER |
|---|---|---|---|---|---|---|---|
| 0 DBR etch | 0.45 mA | 60 ohm | 0.27 W/A | N/A | N/A | N/A | N/A; est. 25 Gbp @ 100 m |
| 5 layer-pair DBR etchdown | 0.55 mA | 113 ohm | 0.26 W/A (1-2 mA) | 2 mW | 29-32 dB (6.5 mA) | 16.5 GHz | 26 Gbp @ 300 m |
| 10 layer-pair DBR etchdown | 1.9 mA | 75 ohm | 0.1 W/A (2-3 mA) | 0.5 mW | 43 dB (9 mA) | 12.4 GHz | N/A |

ADDITIONAL EMBODIMENTS

The insertion of quantum-wells and the innovation of oxide-confined apertures in VCSELs has led to ultralow threshold (<1 mA) and low power operation. Hence, VCSEL has become a practical optical source for the most energy-efficient error-free data transmission up to 57 Gb/s. 850 nm VCSEL based optical transceivers and multimode fibers (MMF) are now widely used for 25 Gb/s NRZ and PAM-4 short-haul (<100 m) optical links in large-scale datacom centers. However, the modulation bandwidth of VCSEL is fundamentally thermally limited by the e-h recombination lifetime which is directly correlated to the diode junction temperature (JT). Due to the self-heating in microcavity VCSEL for high speed operation, the diode JT is considerable different than the ambient temperature. Thus, the bandwidth of VCSEL is reduced by 2 to 3 GHz @ 85° C. resulted in a 7 Gb/s penalty in NRZ error-free transmission down to 50 Gb/s compared to room temperature operation. While VCSEL with multimode optical output may suffice for short distances (<100 meters), the modal dispersion of multimode optical waves in MMF sets a limitation on data speed over longer distances. In order to extend the VCSEL transmission distance beyond 100 m at high speed (>25 Gb/s), single-mode (SM) VCSELs are developed by either reducing oxide aperture size (e.g., less than 3 microns) or etching surface-relief filters to improve side-mode suppression ratio (SMSR) below 30 dB. These techniques have demonstrated transmission over MMF fiber up to 1 km @ 25 Gb/s NRZ error-free transmission at room temperature operation. However, these approaches for SM-VCSELs have a limited temperature operation.

The embodiments described herein provide single mode VCSEL operation up to 85 degrees Celsius and deliver a record speed-distance performance for a 28 Gb Gb/s error-free OM4 transmission up to 1 km (RT) and 22 Gb/s (85° C.) without the use of equalization. This is achieved by including, in the VCSEL, an integrated mode-selective filter (IMSF) with varying filter sizes on 55 Gb/s multimode (MM) VCSELs designed with a ½-λ cavity. The devices demonstrate record 36 Gb/s NRZ error-free transmission up to 1 km (RT) and 32 Gb/s (70 degrees Celsius). The record speed-distance performance (RED) of single-mode (SM), reduce-mode (RM), and multi-mode (MM) VCSELs made from the same VCSEL material structure with different IMSF for extended NRZ error-free transmission of OM4 are summarized in the table below at 25 and 70 degrees Celsius.

Figure 19A:
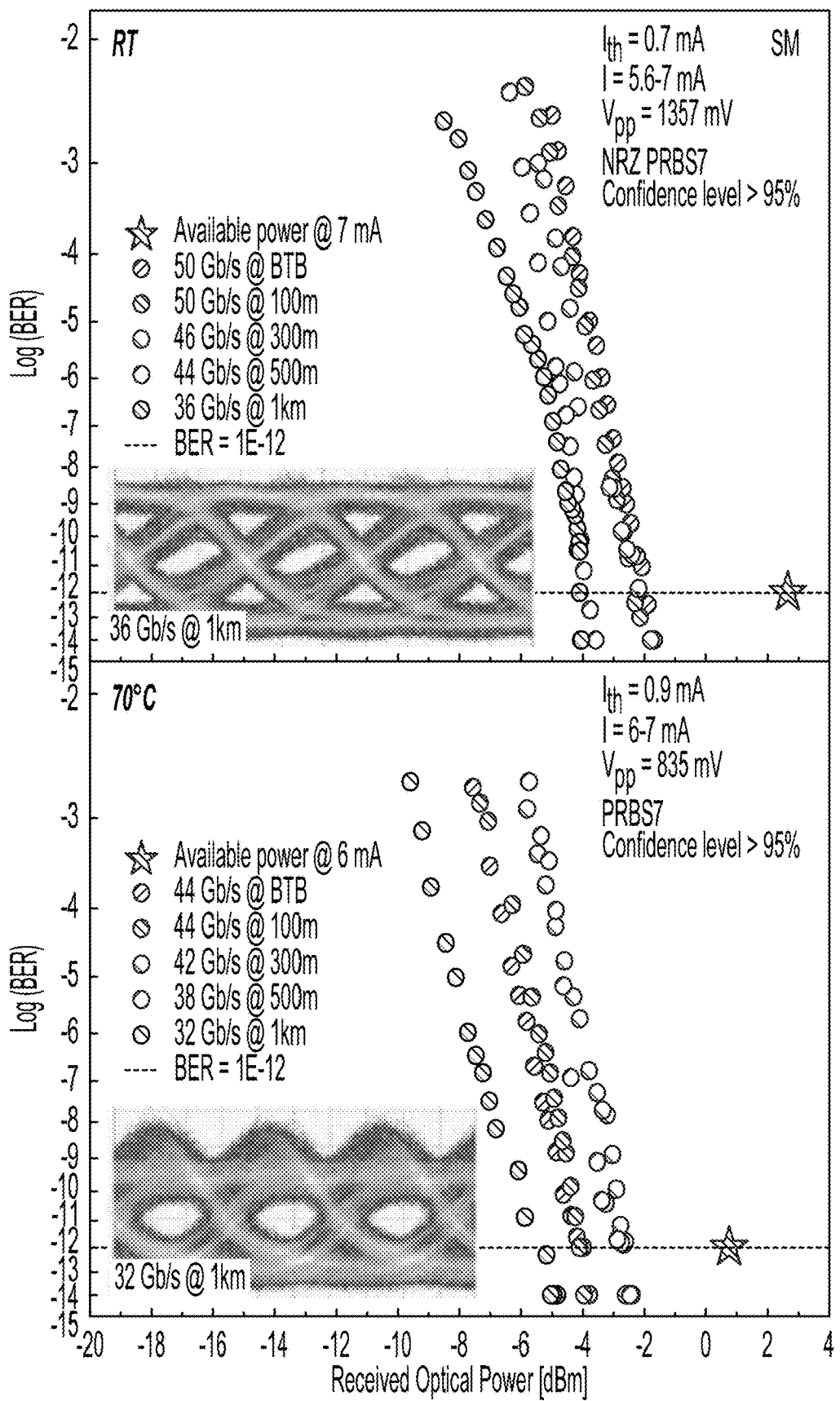
FIGS. 19A, 19B, and 19C illustrate data transmission characteristics of example VCSELs.
Figure 19B:
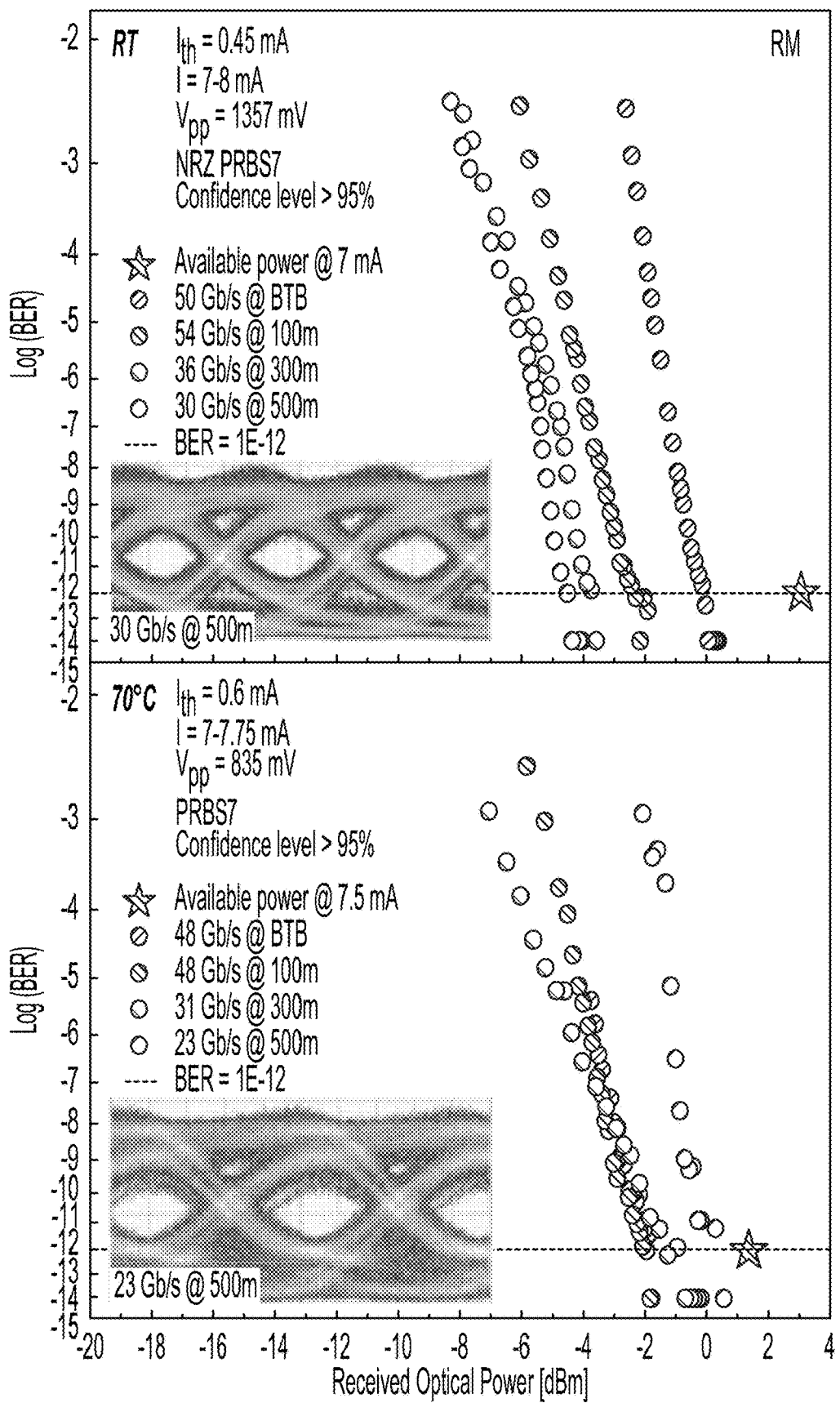
Figure 19C:
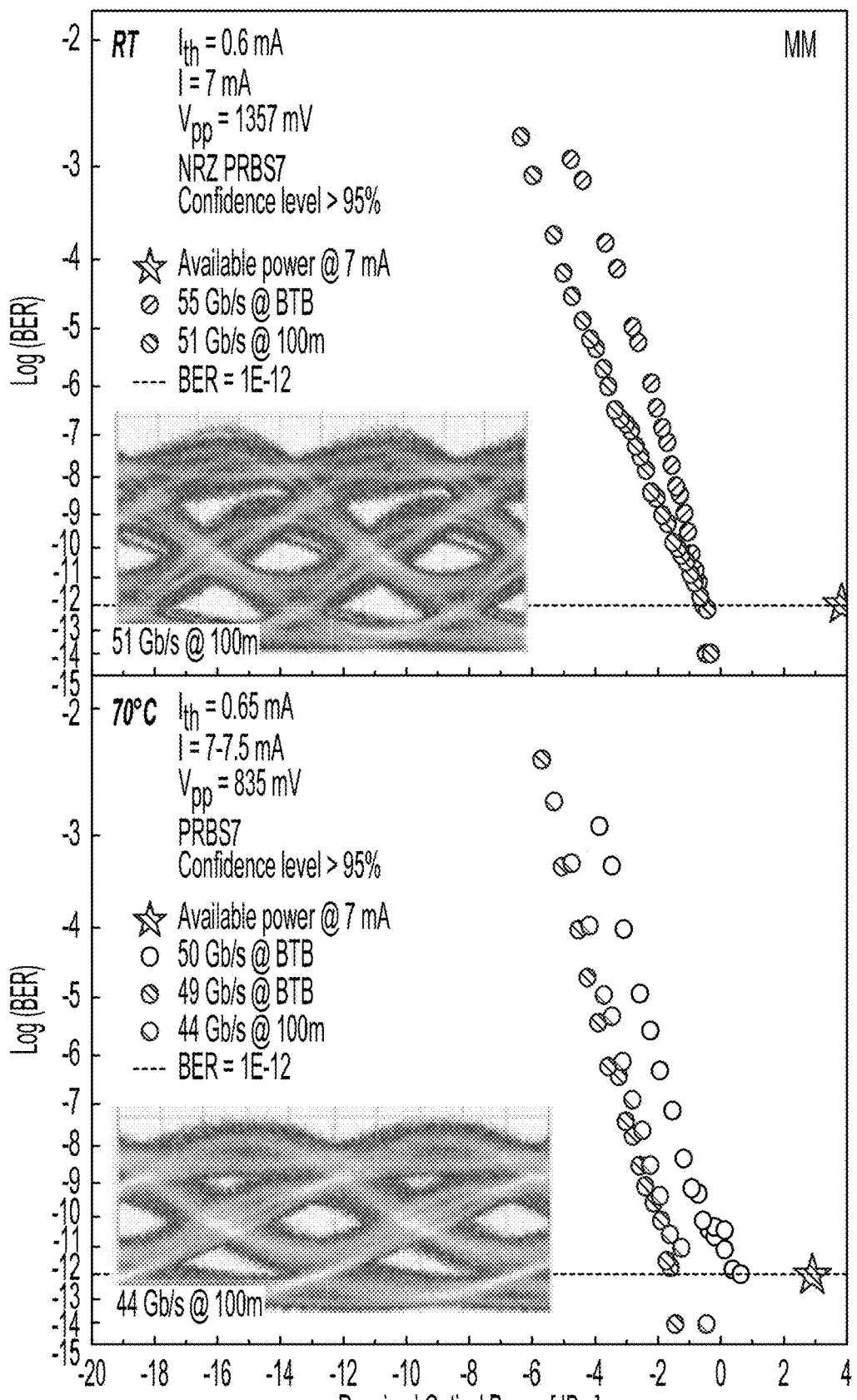

Record Error-Free Transmission (OM4) over Extended Distance for SM, RM, and MM VCSELs BER testing and eye diagram were measured at both RT and 70° C. as shown in FIG. 19. The test bit sequence is NRZ PRBS7 generated by a SHF 12103A bit pattern generator. The optical output is coupled into OM4 MMF of various lengths and converted to electrical signal through a New Focus 1484-A-50 22 GHz high-gain photoreceiver. A Keysight 86100C DCA-J oscilloscope with 70 GHz sampling module is used to capture the eye diagrams and a SHF 11104A error analyzer is used to measure BER. A free-space neutral density filter is used to attenuate the received optical power to mimic channel loss.

The SM, RM, and MM VCSELs demonstrate stable performance up to 70° C. and extended distance up to 1 km in OM4 MMF. At room temperature, the SM VCSELs deliver 50 Gb/s (BTB) and 36 Gb/s (1 km); the RM VCSELs deliver 55 Gb/s (BTB) and 30 Gb/s (500 m); the MM VCSELs deliver 55 Gb/s (BTB) and 51 Gb/s (100 m). At 70° C., the SM VCSELs deliver 44 Gb/s (BTB) and 32 Gb/s (1 km); the RM VCSELs deliver 48 Gb/s over BTB and 23 Gb/s (500 m); the MM VCSELs deliver 49 Gb/s (BTB) and 44 Gb/s (100 m). All results are summarized in the table above with error-free (BER <10-12 with >95% confidence level) without any use of pre-emphasis, FFE, or FEC. It can be observed that the SM VCSEL can easily extend high data rate well beyond 1000 m in comparison with RM or MM

|  | Room Temperature | | | | | 70 Degrees Celsius | | | | |
| --- | --- | --- | --- | --- | --- | --- | --- | --- | --- | --- |
|  | BTB | 100 m | 300 m | 500 m | 1 km | BTB | 100 m | 300 m | 500 m | 1 km |
| SM(Gb/s) | 50 | 50 | 46 | 44 | 36 | 44 | 44 | 42 | 38 | 32 |
| RM(Gb/s) | 55 | 54 | 36 | 30 |  | 48 | 48 | 31 | 23 |  |
| MM(Gb/s) | 55 | 51 |  |  |  | 49 | 44 |  |  |  |

VCSEL DC Characteristics

The 850 nm, ½-λ cavity VCSEL epitaxial structure consists of 5 GaAs/$Al_{0.2}Ga_{0.8}As$ quantum-wells with $Al_{0.3-0.9}Ga_{0.7-0.1}As$ cladding layers, with 20-layer-pair p+-DBR and p+-GaAs cap on the top, and 30-layer-pair n+-DBR, intrinsic-GaAs buffer and semi-insulating GaAs substrate at the bottom. The p+- and n+-DBR are $Al_{0.9}Ga_{0.1}As$/$Al_{0.12}Ga_{0.88}As$ doped with carbon and silicon, respectively. At the bottom of p+-DBR, there are two sets of 30 nm p+-$Al_{0.98}Ga_{0.02}As$ current confinement layers formed using lateral oxidation, which also becomes the optical aperture. The integrated MSF is also formed by oxidation process on the top P+-DBR.

Figure 17A:
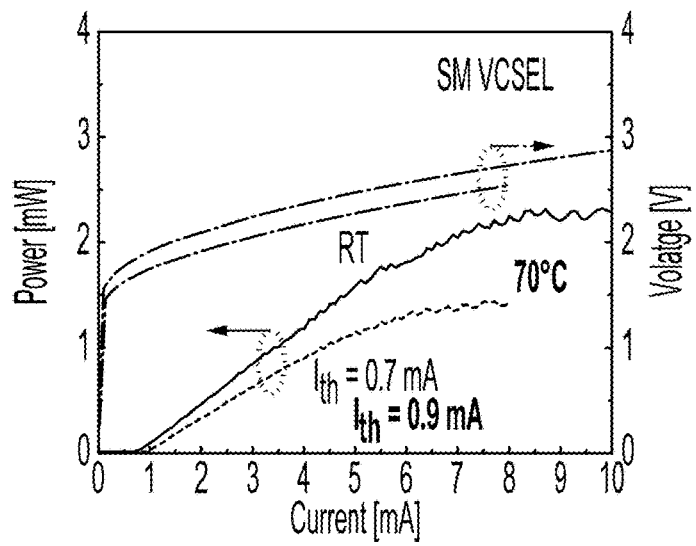
FIGS. 17A, 17B, and 17C illustrate the L-I-V characteristics of different example VCSELs.
Figure 17B:
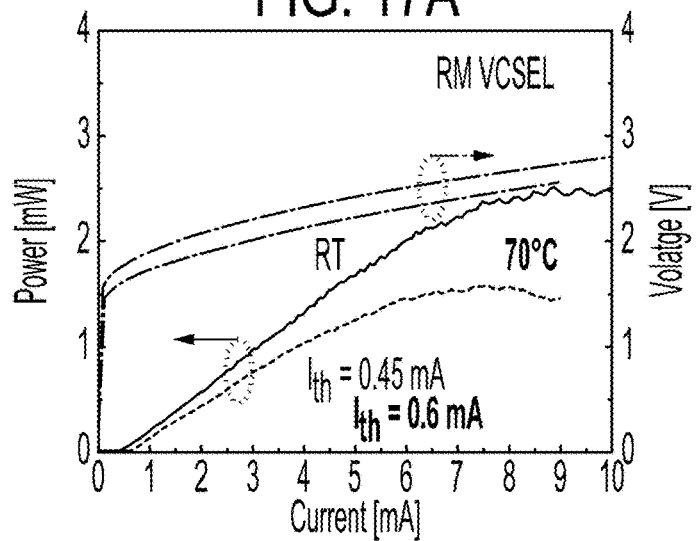
Figure 17C:
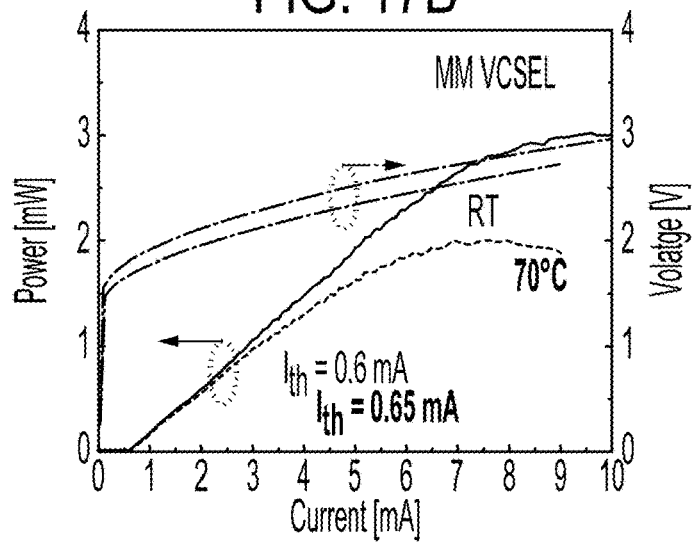
Figure 18A:
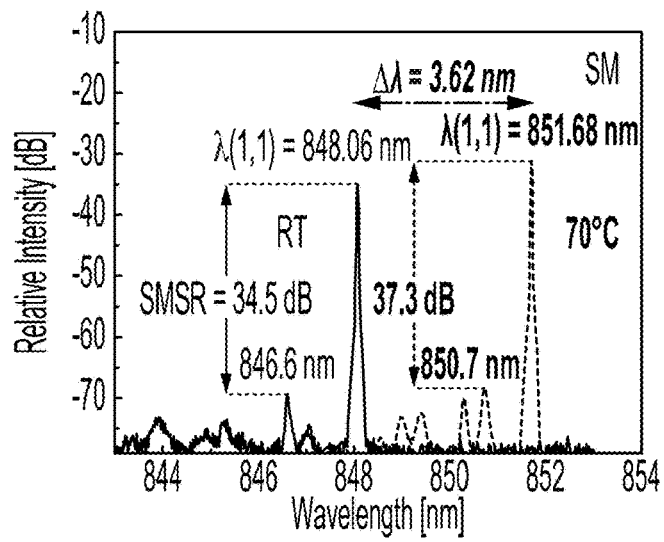
FIGS. 18A, 18B, and 18C illustrate optical responses of example VCSELs.
Figure 18B:
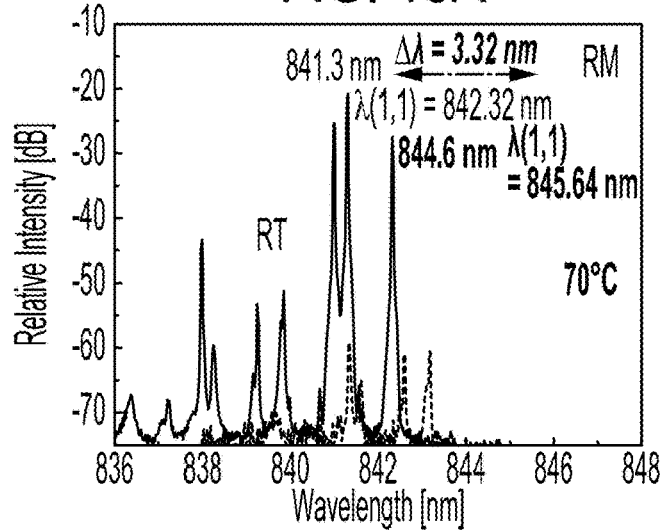
Figure 18C:
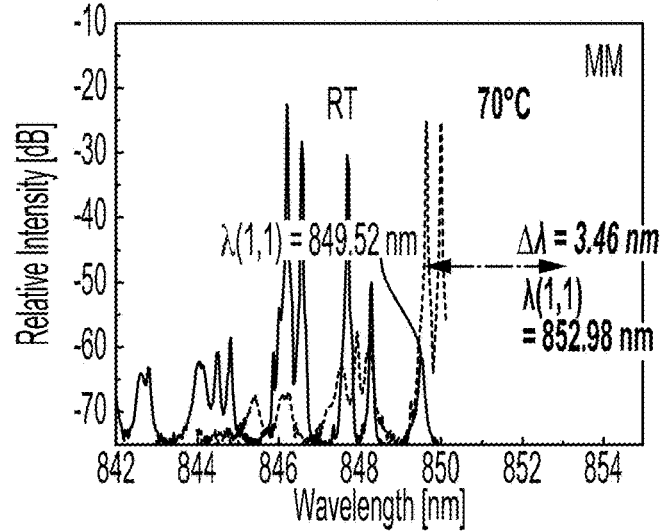

The fabricated SM, RM, and MM VCSEL L-I-V characteristics are measured at both RT and 70° C. heatsink temperature, shown in frames (a)-(c) of FIG. 17, respectively. The device threshold ranges from 0.45 mA to 0.7 mA at room temperature, increasing to 0.6-0.9 mA at 70° C. The SM and RM VCSELs reach a peak output power of above 2 mW at room temperature, while the MM VCSEL can reach 3 mW. At 70° C. the output power drops by ~40% but stays above 1 mW. FIG. 18 shows the laser optical spectrum taken at BER testing current bias. The SM VCSEL shows the stable single-mode operation (fundamental <111> mode) with SMSR >34 dB maintained across the biasing and temperature range up to 70° C. The RM VCSEL spectrum shows ~2 dominant modes (fundamental <111> mode, 1st order <211> and <121> modes). The MM VCSEL shows more than three modes with a strong second-order mode and suppressed fundamental mode.

devices due to the reduction of modal dispersion, despite having slightly slower speed at BTB. At 70° C. the link suffers from a 5-7 Gb/s penalty, which corresponds to a ~3 GHz bandwidth shrinking.

An integrated mode selective filter on VCSELs was developed for improving signal integrity on data transmission for extended distance up to 1 km in OM4 MMF and stable temperature operation up to 70° C. The experimental results confirm the single-mode VCSEL can extend distance up to 500 m with the data rate of 44 Gb/s (RT) and 38 Gb/s (70 degrees Celsius) as well as up to 1 km for 36 Gb/s (RT) and 32 Gb/s (70 degrees Celsius). Both reduced-mode and multimode VCSELs suffer from dispersion-limited data rate over distance.

IV. CONCLUSION

The above detailed description describes various features and functions of the disclosed systems, devices, and methods with reference to the accompanying figures. In the figures, similar symbols typically identify similar components, unless context indicates otherwise. The illustrative embodiments described in the detailed description, figures, and claims are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flowcharts in the figures and as discussed herein, each step, block and/or communication may represent a processing of information and/or a transmission of information in accordance with example embodiments. Alternative embodiments are included within the scope of these example embodiments. In these alternative embodiments, for example, functions described as steps, blocks, transmissions, communications, requests, responses, and/or messages may be executed out of order from that shown or discussed, including in substantially concurrent or in reverse order, depending on the functionality involved. Further, more or fewer steps, blocks and/or functions may be used with any of the message flow diagrams, scenarios, and flow charts discussed herein, and these message flow diagrams, scenarios, and flow charts may be combined with one another, in part or in whole.

A step or block that represents a processing of information may correspond to circuitry that can be configured to perform the specific logical functions of a herein-described method or technique. Alternatively or additionally, a step or block that represents a processing of information may correspond to a module, a segment, or a portion of program code (including related data). The program code may include one or more instructions executable by a processor for implementing specific logical functions or actions in the method or technique. The program code and/or related data may be stored on any type of computer-readable medium, such as a storage device, including a disk drive, a hard drive, or other storage media.

The computer-readable medium may also include non-transitory computer-readable media such as computer-readable media that stores data for short periods of time like register memory, processor cache, and/or random access memory (RAM). The computer-readable media may also include non-transitory computer-readable media that stores program code and/or data for longer periods of time, such as secondary or persistent long term storage, like read only memory (ROM), optical or magnetic disks, and/or compact-disc read only memory (CD-ROM), for example. The computer-readable media may also be any other volatile or non-volatile storage systems. A computer-readable medium may be considered a computer-readable storage medium, for example, or a tangible storage device.

Moreover, a step or block that represents one or more information transmissions may correspond to information transmissions between software and/or hardware modules in the same physical device. However, other information transmissions may be between software modules and/or hardware modules in different physical devices.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

We claim:

1. A vertical-cavity surface-emitting laser comprising:
 a base reflective element;
 a gain element;
 a current-injection reflective element, wherein the current-injection reflective element comprises a first portion of a first distributed Bragg reflector (DBR), wherein the current-injection reflective element includes a current-injection aperture having a first diameter, wherein the gain element is disposed between the base reflective element and the current-injection reflective element, and wherein at least a portion of the current-injection reflective element has a second diameter that is greater than the first diameter;
 an electrode electrically coupled to the current-injection reflective element such that current passing though the electrode into the current-injection reflective element passes into the gain element via the current-injection aperture; and
 a mode-selective reflective element, wherein the mode-selective reflective element comprises a second portion of the first DBR, wherein the mode-selective reflective element includes a mode-selective aperture having a third diameter that is less than the first diameter, wherein the current-injection reflective element is disposed between the gain element and the mode-selective reflective element, and wherein at least a portion of the mode-selective reflective element has a fourth diameter that is greater than the third diameter.

2. The vertical-cavity surface-emitting laser of claim 1, wherein the base reflective element comprises a second DBR.

3. The vertical-cavity surface-emitting laser of claim 1, wherein the electrode comprises a metal in contact with the current-injection reflective element.

4. The vertical-cavity surface-emitting laser of claim 1, wherein the electrode comprises:
 a low-bandgap, positively-doped semiconductor material in contact with the current-injection reflective element; and
 a metal in contact with the low-bandgap, positively-doped semiconductor material, wherein the low-bandgap, positively-doped semiconductor material is disposed between the metal and the current-injection reflective element.

5. The vertical-cavity surface-emitting laser of claim 1, wherein the first diameter is less than the fourth diameter.

6. The vertical-cavity surface-emitting laser of claim 1, wherein the first diameter is greater than twice the third diameter.

7. The vertical-cavity surface-emitting laser of claim 1, wherein the third diameter is selected such that, when a supra-threshold current is passed through the electrode and a temperature of the vertical-cavity surface-emitting laser is within an operating temperature range between 0 degrees and 85 degrees Celsius, the vertical-cavity surface-emitting laser emits emitted light exhibiting a first mode power that is at least 30 dB greater than a second mode power of the emitted light.

8. The vertical-cavity surface-emitting laser of claim 1, wherein the gain element comprises at least one quantum well.

9. The vertical-cavity surface-emitting laser of claim 1, wherein the mode-selective reflective element comprises at least 10 layer-pairs of the first DBR.

10. The vertical-cavity surface-emitting laser of claim 1, wherein the mode-selective reflective element comprises at least 15 layer-pairs of the first DBR.

11. The vertical-cavity surface-emitting laser of claim 1, wherein the third diameter is between 2.5 microns and 3.5 microns.

12. The vertical-cavity surface-emitting laser of claim 1, wherein at least one layer-pair of the first DBR comprises a layer of GaAs and a layer of $Al_xGa_{1-x}As$.

13. The vertical-cavity surface-emitting laser of claim 1, wherein a composition of the second portion of the first DBR within the mode-selective reflective element differs from a composition of the first portion of the first DBR within the current-injection reflective element.

14. The vertical-cavity surface-emitting laser of claim 13, wherein the second portion of the first DBR within the mode-selective reflective element comprises a layer of GaAs and a layer of $Al_XGa_{1-X}As$, wherein the first portion of the first DBR within the current-injection reflective element comprises a layer of GaAs and a layer of $Al_YGa_{1-Y}As$, and wherein the fraction Y is greater than the fraction X.

15. The vertical-cavity surface-emitting laser of claim 1, wherein the current-injection aperture is incorporated into a subset of layers of the first portion of the first DBR that are within the current-injection reflective element.

16. A method for fabricating a vertical-cavity surface-emitting laser, the method comprising:
forming a mode-selective reflective mesa having a first diameter from a substrate, wherein the substrate comprises:
a base reflective element;
a gain element;
a first upper reflective element having a first thickness, wherein the first upper reflective element comprises at least one layer-pair of a distributed Bragg reflector (DBR) having a first composition, and wherein the gain element is disposed within the substrate between the base reflective element and the first upper reflective element; and
a second upper reflective element, wherein the second upper reflective element comprises at least one layer-pair of a DBR having a second composition that differs from the first composition, and wherein the second upper reflective element is disposed within the substrate between the gain element and the first upper reflective element;
wherein forming the mode-selective reflective mesa from the substrate comprises etching at least a portion of the substrate to a depth less than the first thickness;
forming, in the mode-selective reflective mesa via lateral oxidation at a first temperature, a mode-selective aperture having a second diameter that is less than the first diameter;
forming a current-injection reflective mesa having a third diameter from the substrate, wherein the third diameter is greater than the first diameter, and wherein forming the current-injection reflective mesa from the substrate comprises etching at least a portion of the substrate to a depth greater than the first thickness; and
forming, in the current-injection reflective mesa via lateral oxidation at a second temperature, a current injection aperture having a fourth diameter that is less than the third diameter and that is greater than the second diameter.

17. The method of claim 16, wherein the first composition specifies alternating layers of GaAs and $Al_XGa_{1-X}As$, wherein the second composition specifies alternating layers of GaAs and $Al_YGa_{1-Y}As$, and wherein the fraction Y is greater than the fraction X.

18. The method of claim 16, wherein the gain element and second upper reflective element have a second combined thickness, and wherein etching the current-injection reflective mesa into the substrate comprises etching the substrate to a depth greater than a sum of the first thickness and second combined thickness.

19. The method of claim 16, further comprising:
forming, on the current-injection reflective mesa via an epitaxial growth method, a low-bandgap, positively-doped semiconductor material.

20. The method of claim 16, wherein the second temperature is less than the first temperature.

* * * * *